(12) United States Patent
Lin et al.

(10) Patent No.: US 7,863,608 B2
(45) Date of Patent: Jan. 4, 2011

(54) HIGH EFFICIENCY LIGHTING DEVICE AND METHOD FOR FABRICATING THE SAME

(75) Inventors: Ching-Fuh Lin, Taipei (TW); Cha-Hsin Chao, Taipei (TW)

(73) Assignee: National Taiwan University, Taipei (TW)

( * ) Notice: Subject to any disclaimer, the term of this patent is extended or adjusted under 35 U.S.C. 154(b) by 103 days.

(21) Appl. No.: 12/382,695

(22) Filed: Mar. 23, 2009

(65) Prior Publication Data
US 2010/0133527 A1    Jun. 3, 2010

(30) Foreign Application Priority Data
Nov. 28, 2008    (TW) .............. 97146346 A

(51) Int. Cl.
*H01L 29/10* (2006.01)
*H01L 29/12* (2006.01)

(52) U.S. Cl. .......... 257/43; 257/E31.126; 257/E33.064; 438/46; 438/609; 977/811

(58) Field of Classification Search .......... 257/43, 257/E31.126, E33.064; 438/46, 609; 977/811
See application file for complete search history.

(56) References Cited

U.S. PATENT DOCUMENTS

| | | | |
|---|---|---|---|
| 7,265,392 B2 | 9/2007 | Hahn et al. | |
| 2006/0154389 A1* | 7/2006 | Doan | ............ 438/21 |
| 2007/0041214 A1* | 2/2007 | Ha et al. | ............ 362/612 |
| 2007/0158661 A1 | 7/2007 | Lu et al. | |
| 2007/0235738 A1* | 10/2007 | Jin et al. | ............ 257/79 |
| 2009/0032800 A1* | 2/2009 | Lee et al. | ............ 257/13 |
| 2009/0146142 A1* | 6/2009 | Kim et al. | ............ 257/43 |
| 2009/0267164 A1* | 10/2009 | Wunnicke et al. | ............ 257/414 |

FOREIGN PATENT DOCUMENTS

TW                269779          1/2007

OTHER PUBLICATIONS

H. Amano, N. Sawaki, and I. Akasaki; Metalorganic Vapor Phase Epitaxial Growth of a High Quality GaN Film Using an AIN Buffer Layer; Appl. Phys. Lett. 48 (5), Feb. 3, 1986, pp. 353-355.
S. Nakamura, T. Mukai, M. Senoh, N. Iwasa; Thermal Annealing Effects on P-Type Mg-Doped GaN Films; Jpn. J. Appl. Phys. vol. 31 (1992), pp. L139-L142, Part 2, No. 2B, Feb. 15, 1992.

(Continued)

*Primary Examiner*—W. David Coleman
(74) *Attorney, Agent, or Firm*—Rosenberg, Klein & Lee

(57) ABSTRACT

The present invention discloses a high-efficiency lighting device and a method for fabricating the same. The method of the present invention comprises steps: providing an insulation substrate and sequentially forming an electrode layer and a seed layer on the insulation layer; forming a plurality of zinc oxide micro and nano structures and a plurality of first insulation units on the seed layer, wherein each zinc oxide micro and nano structure is arranged between two neighboring first insulation units; forming a nitride layer on the side wall of each zinc oxide micro and nano structure; and forming an electrode layer on each nitride layer. The present invention achieves a high-efficiency lighting device via growing nitride layers on the side walls of zinc oxide micro and nano structures. Further, the present invention can reduce the fabrication cost.

31 Claims, 24 Drawing Sheets

OTHER PUBLICATIONS

S. Nakamura, M. Senoh, N. Iwasa, S. Nagahama, T. Yamada, T. Mukai; Superbright Green InGaN Single-Quantum-Well-Structure Light-Emitting Diodes; Jpn. J. Appl. Phys. vol. 34 (1995) pp. L 1332-L 1335, Part 2, No. 10B, Oct. 15, 1995.

Y. Narukawa, I. Niki, K. Izuno, M. Yamada, Y. Murazaki, T. Mukai; Phosphor-Conversion White Light Emitting Diode Using InGaN Near-Ultraviolet Chip; Jpn. J. Appl. Phys. vol. 41 (2002) pp. L 371-L 373, Part. 2, No. 4A, Apr. 1, 2002.

S. An, W. Park, G. Yi; Heteroepitaxal Fabrication and Structural Characterizations of Ultrafine GaN/ZnO Coaxial Nanorod Heterostructures; Applied Physics Letters, vol. 84, No. 18, May 3, 2004, pp. 3612-3614.

* cited by examiner

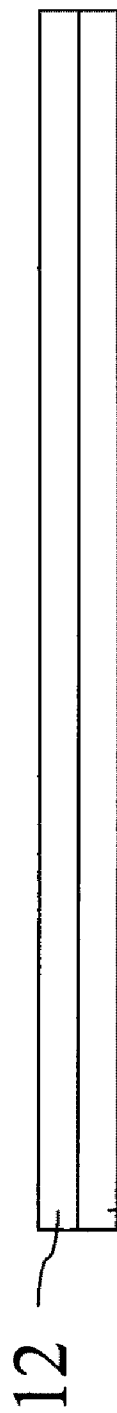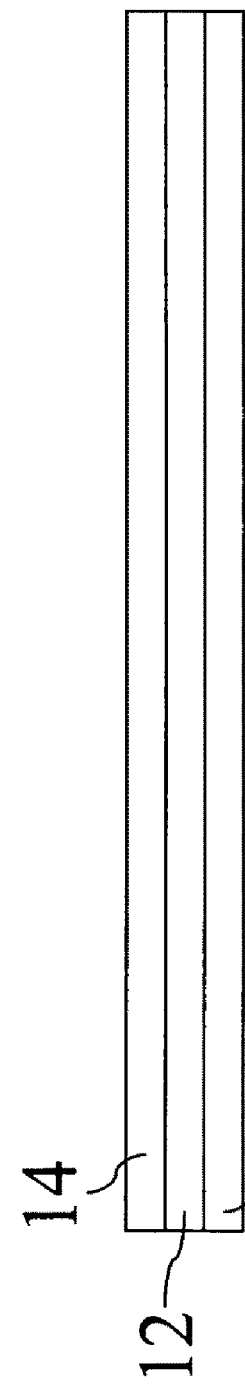

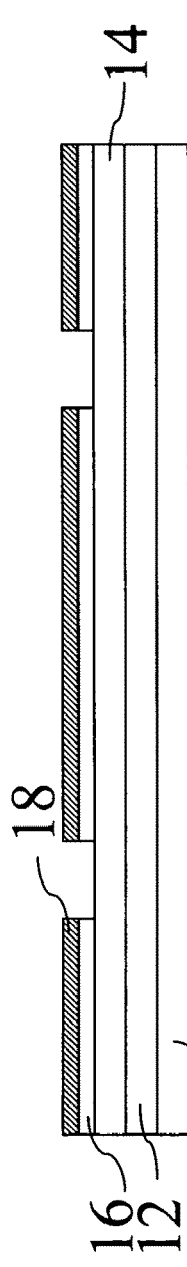
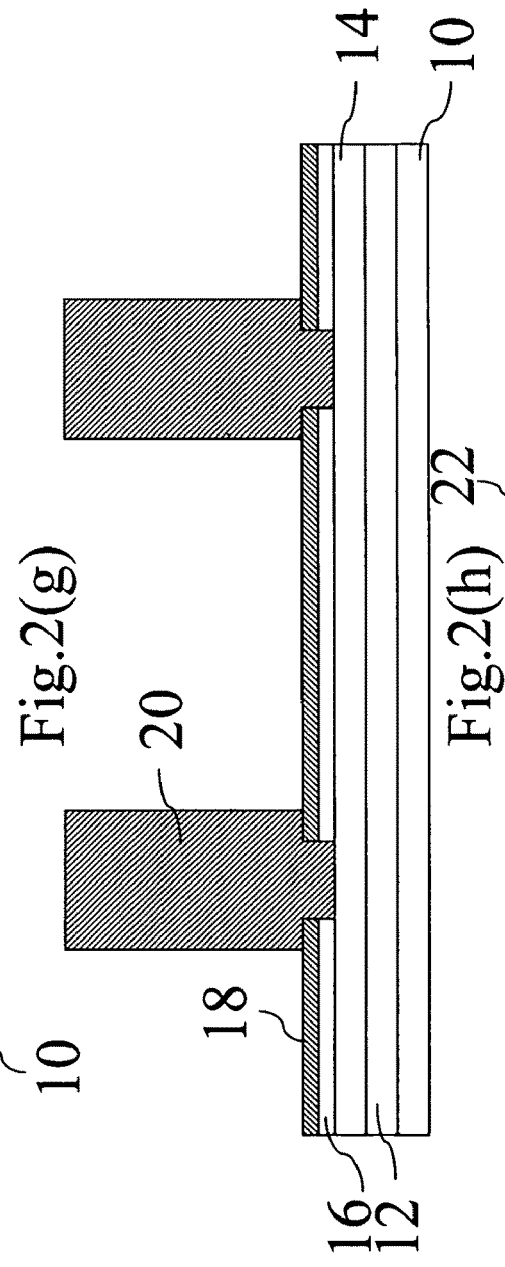
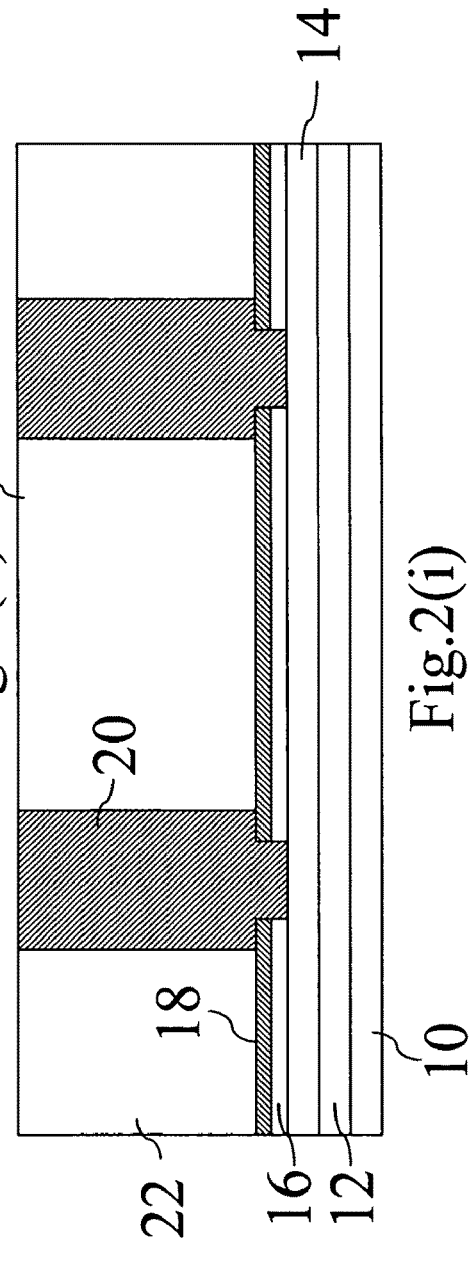
Fig.2(g)
Fig.2(h)
Fig.2(i)

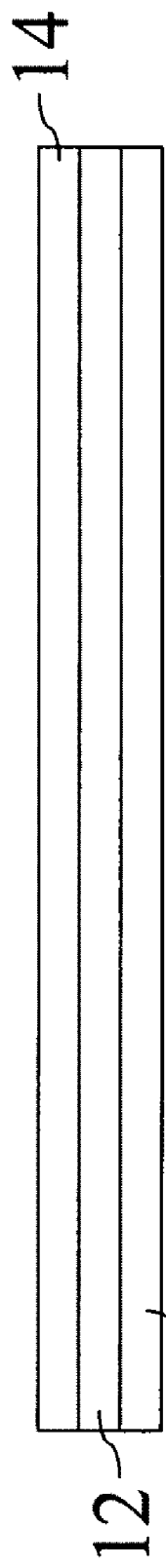

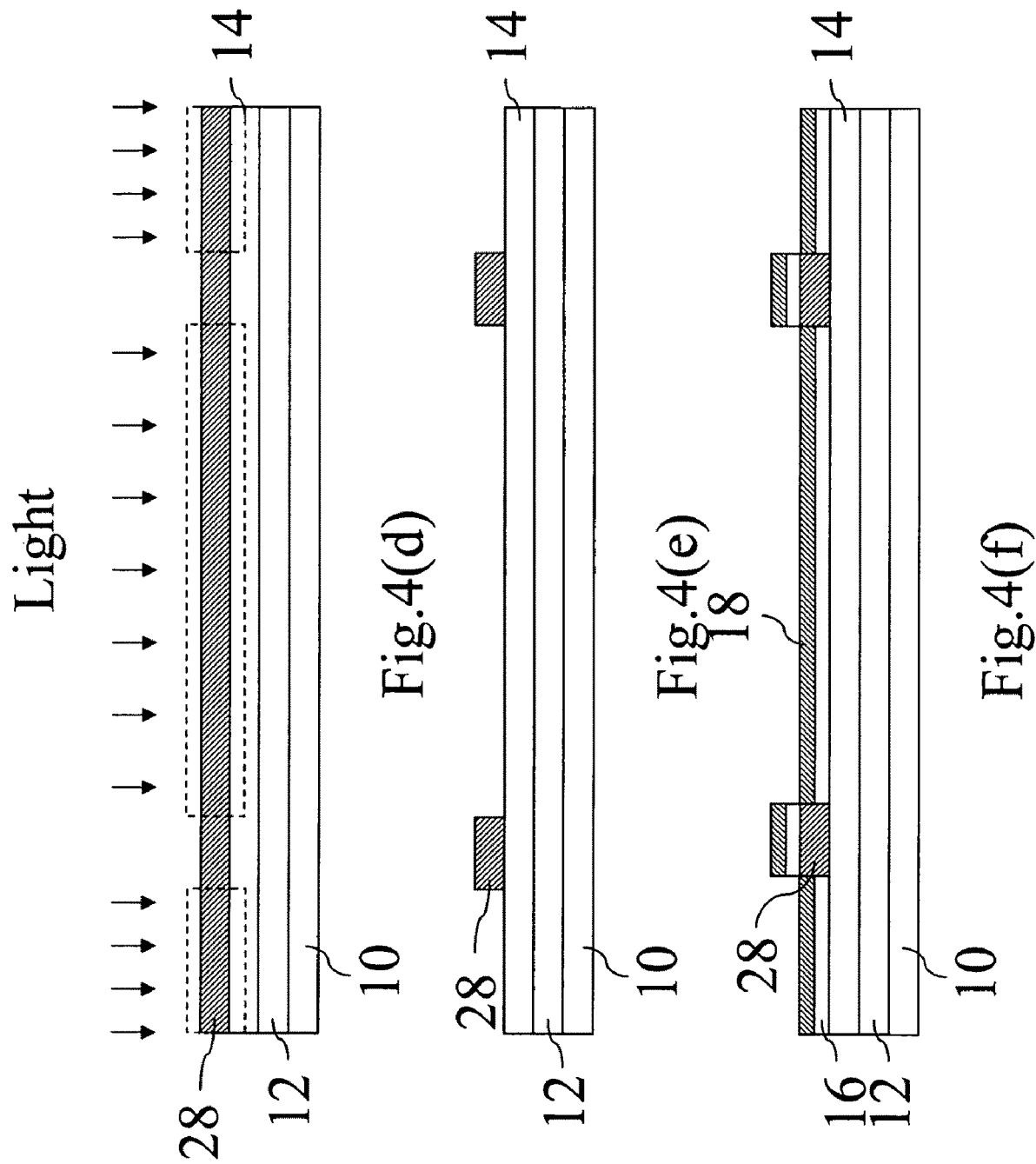

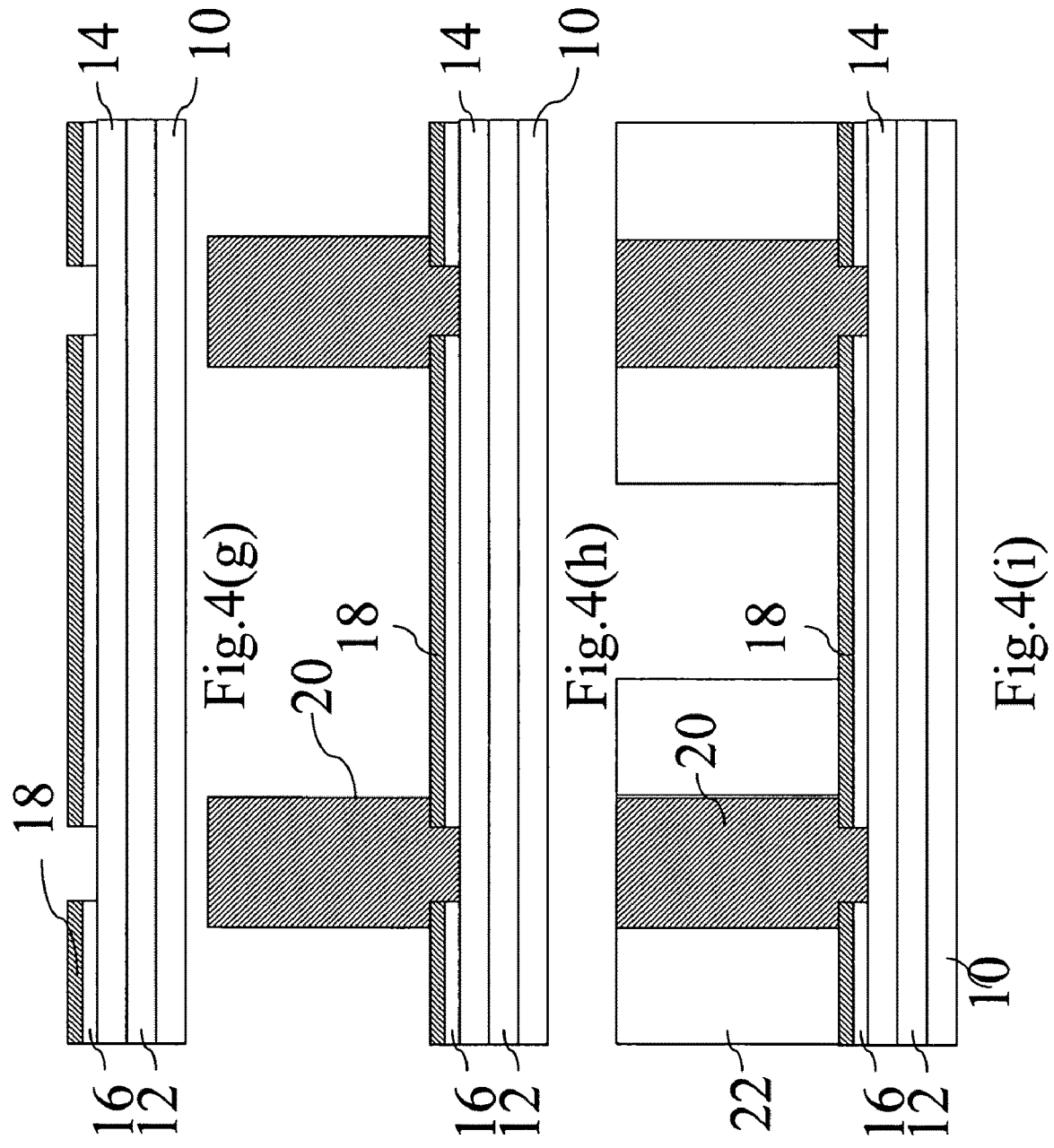

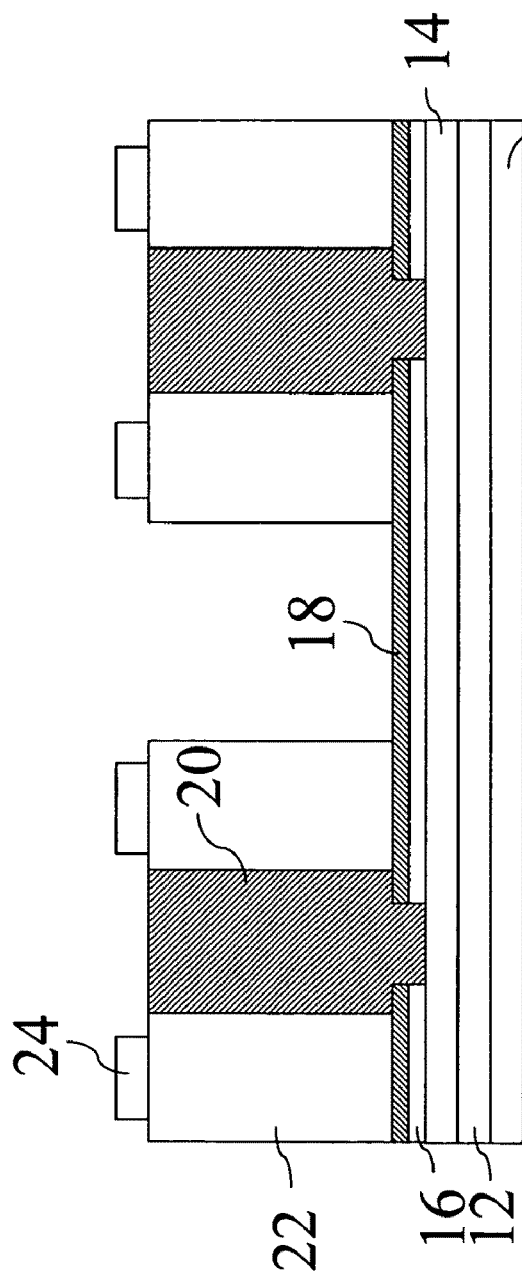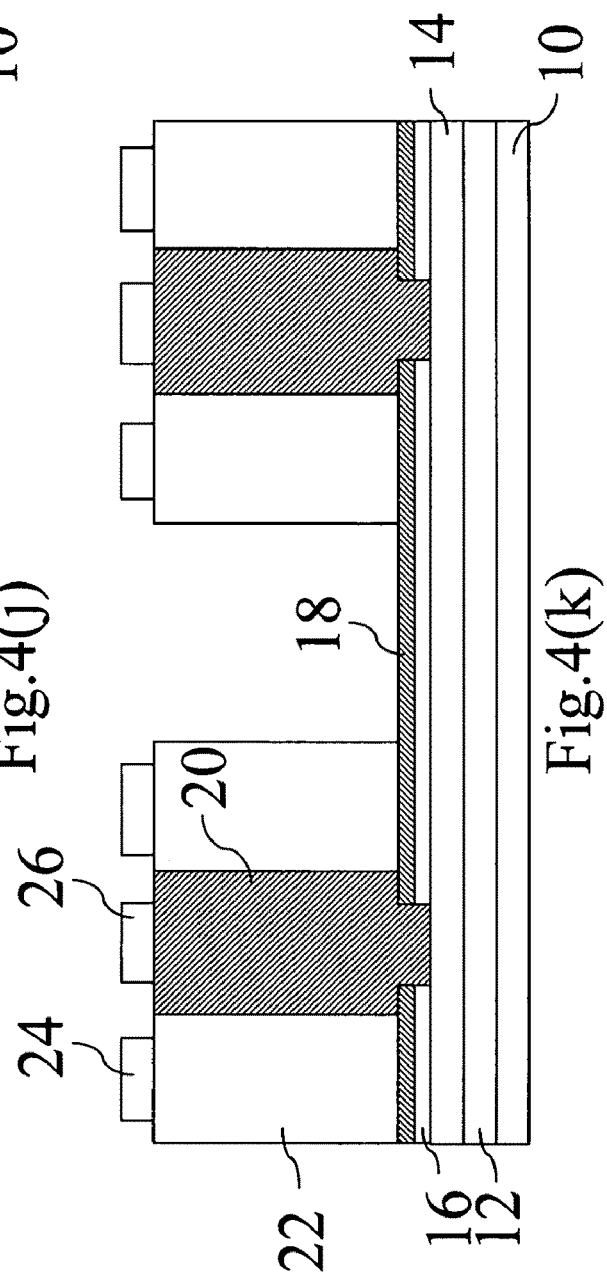

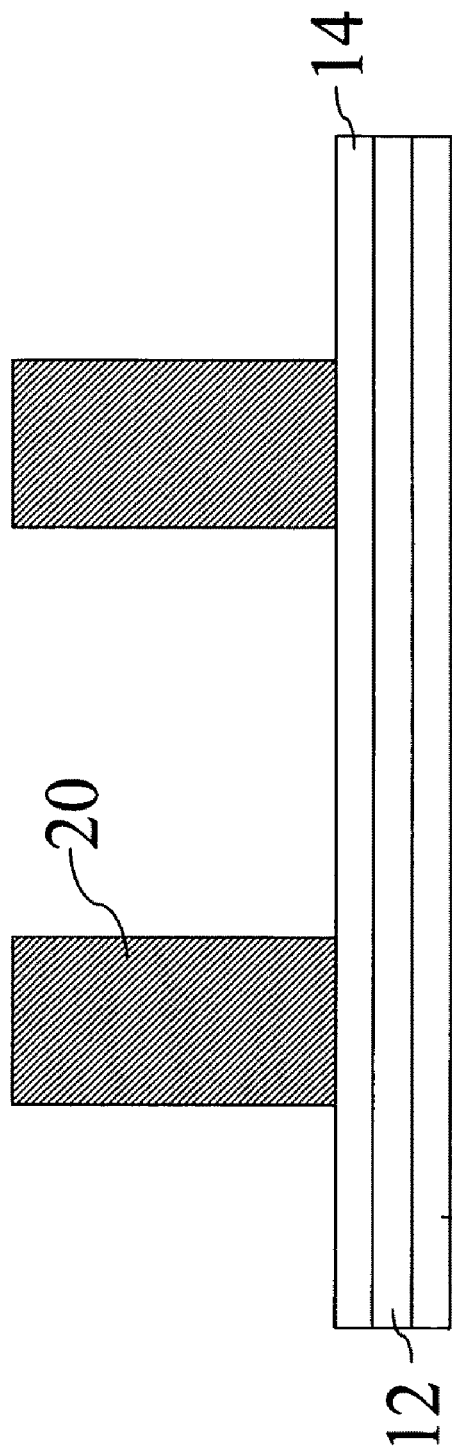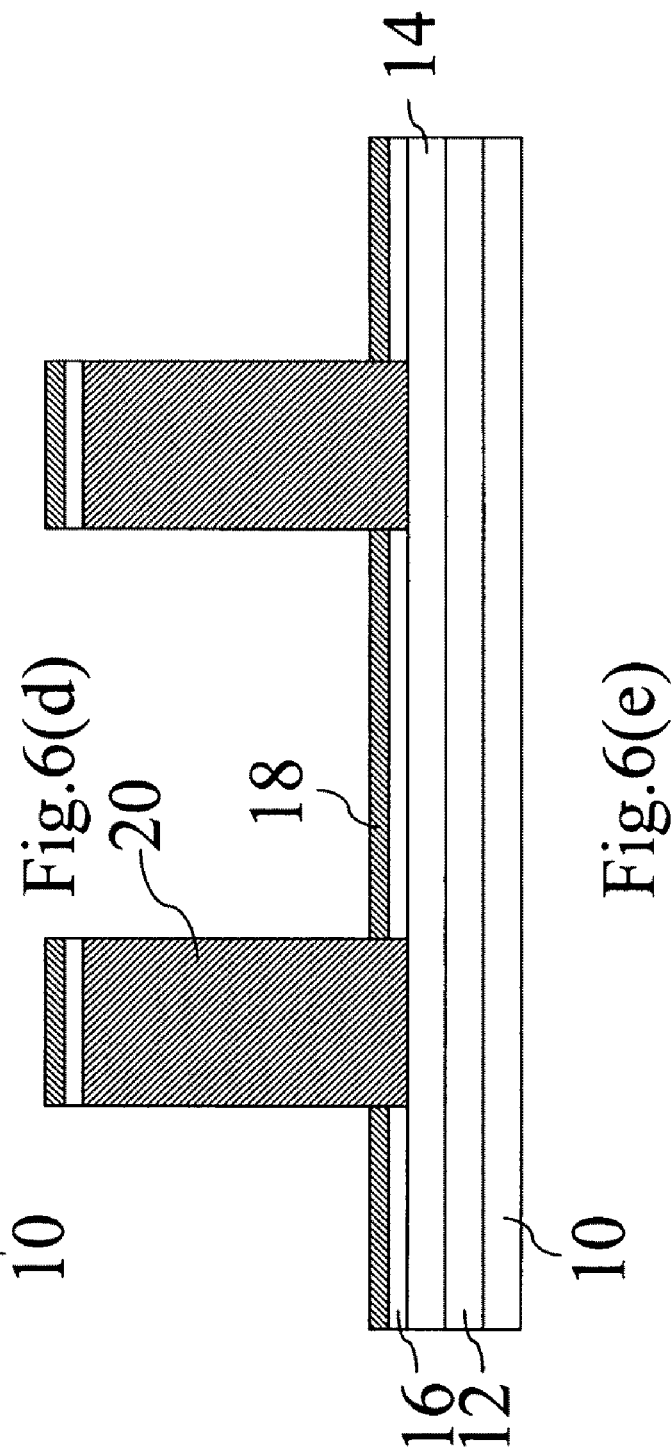

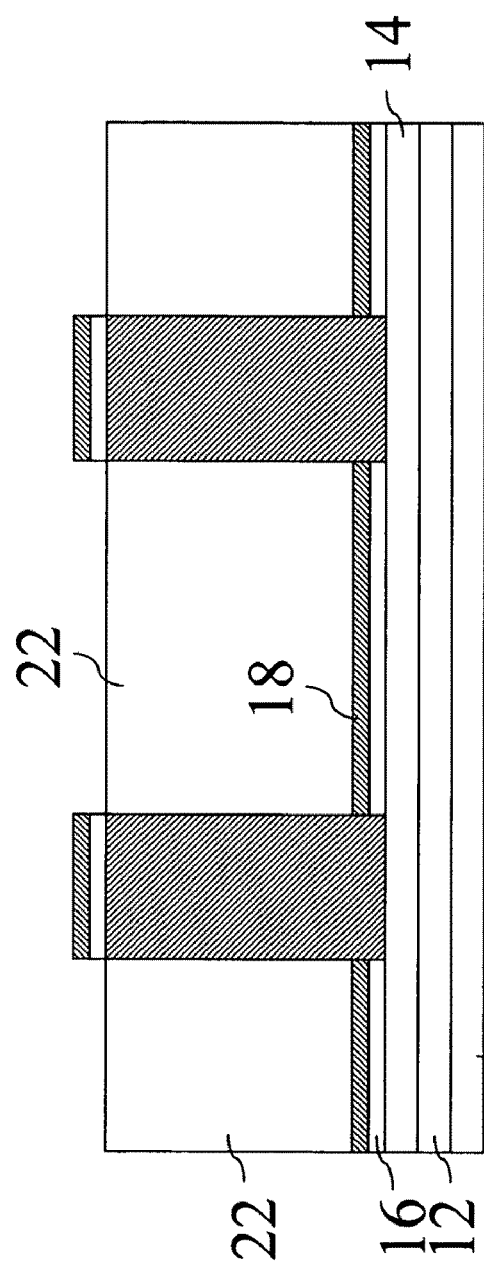
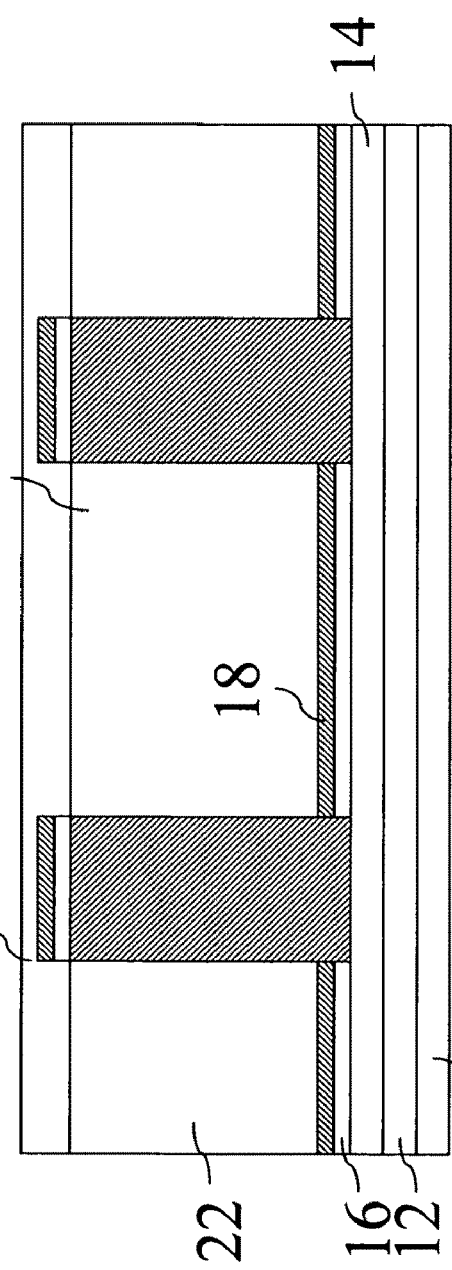
Fig.6(f)
Fig.6(g)

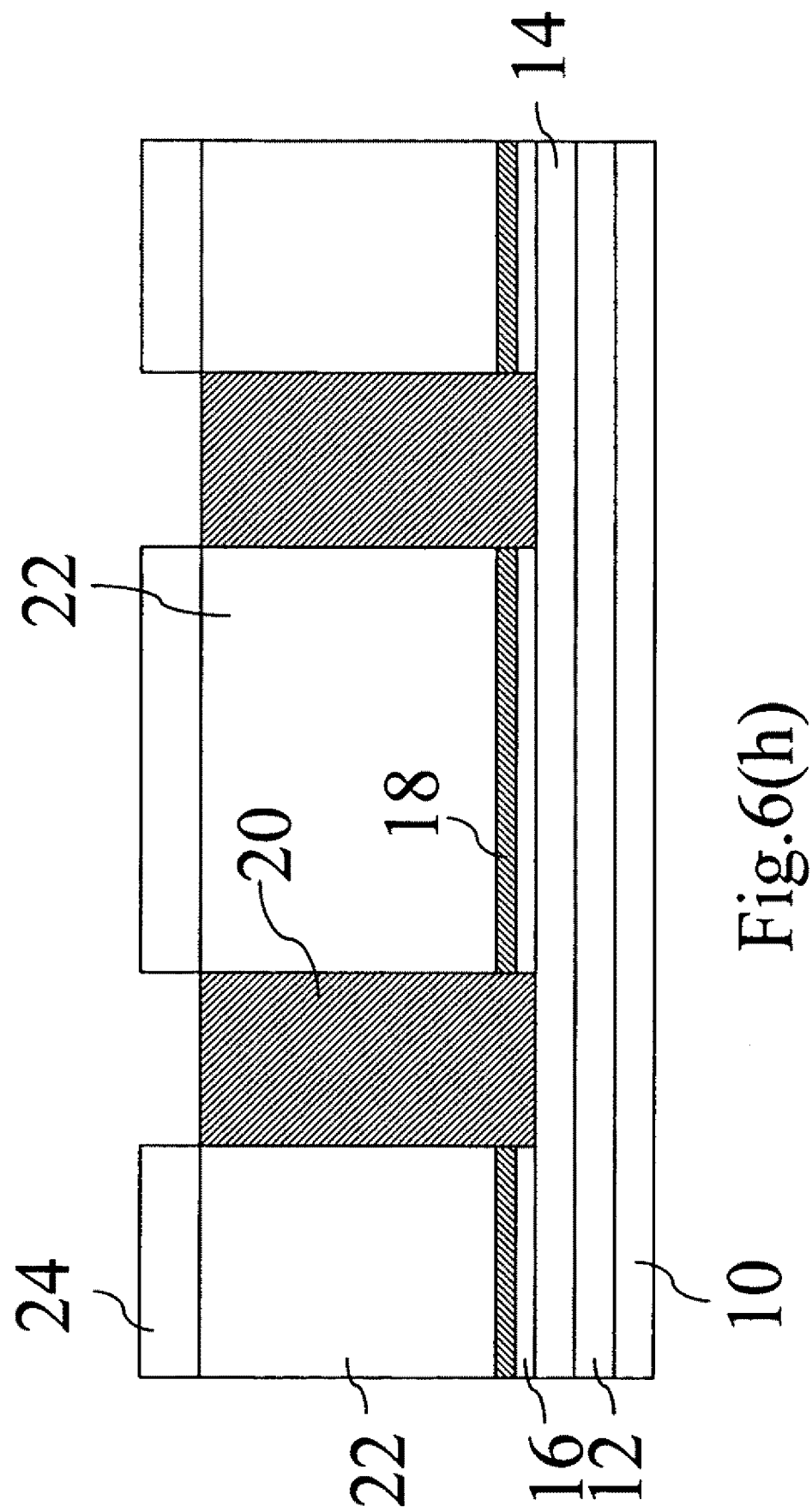

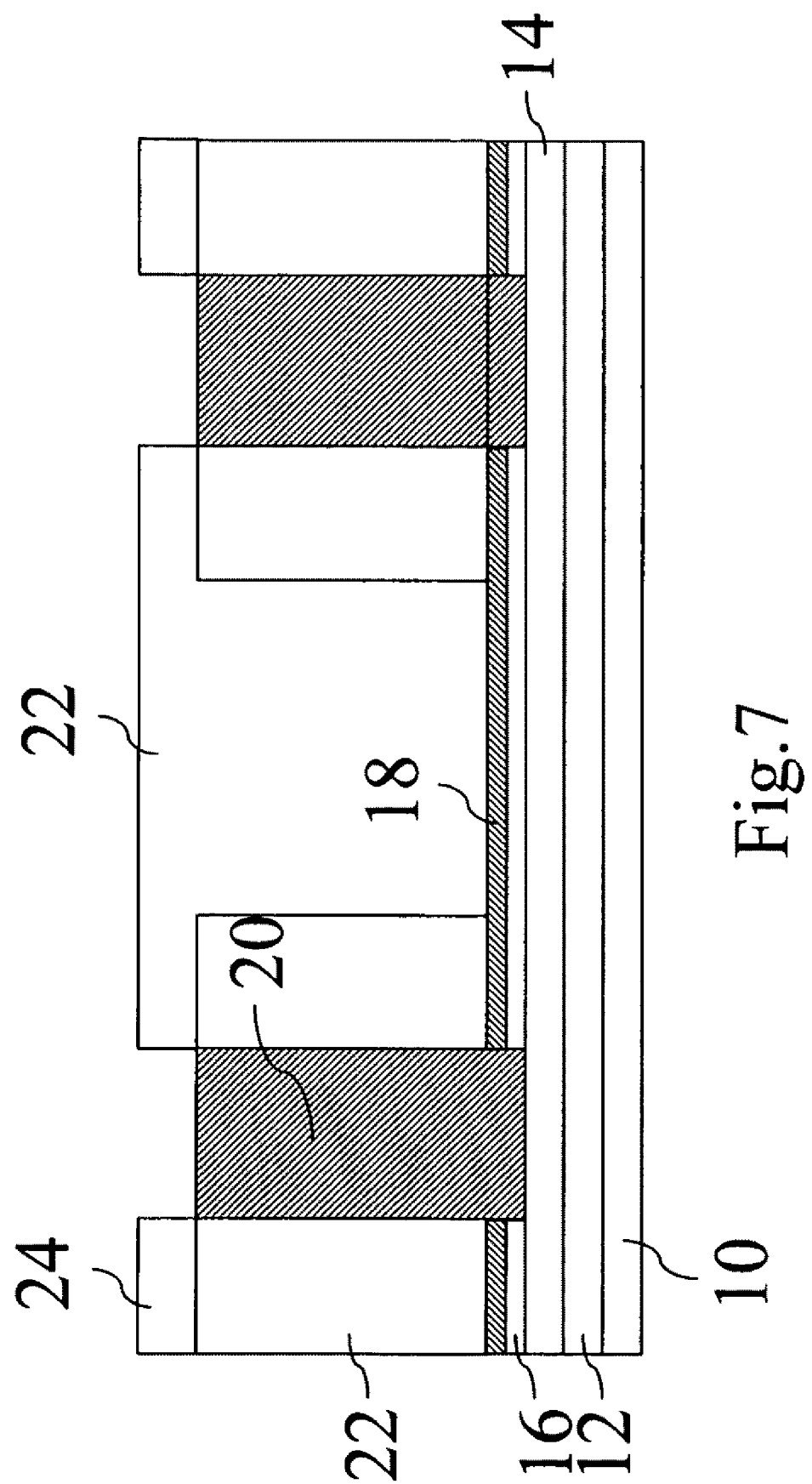

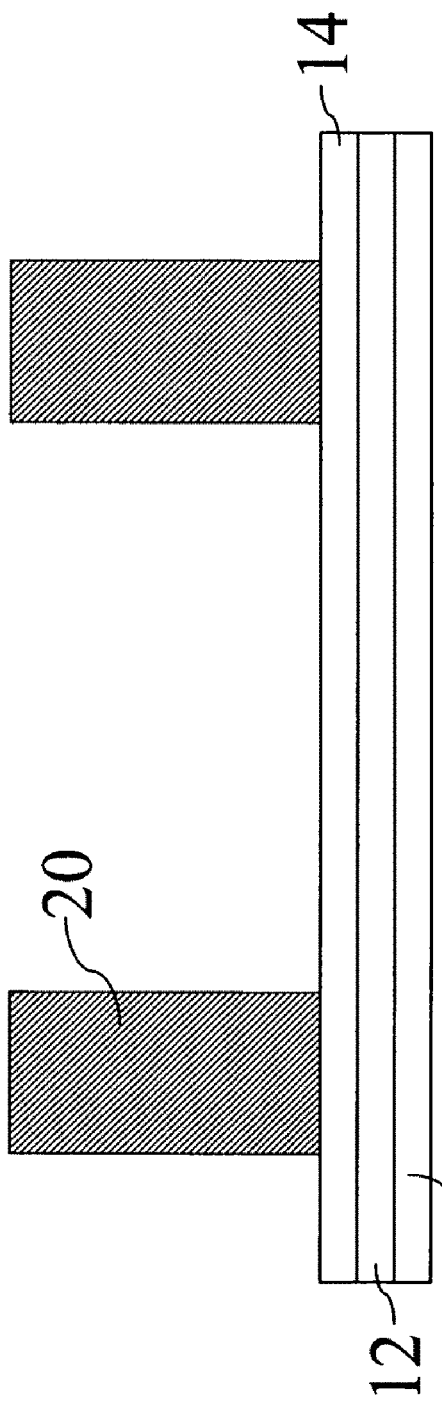
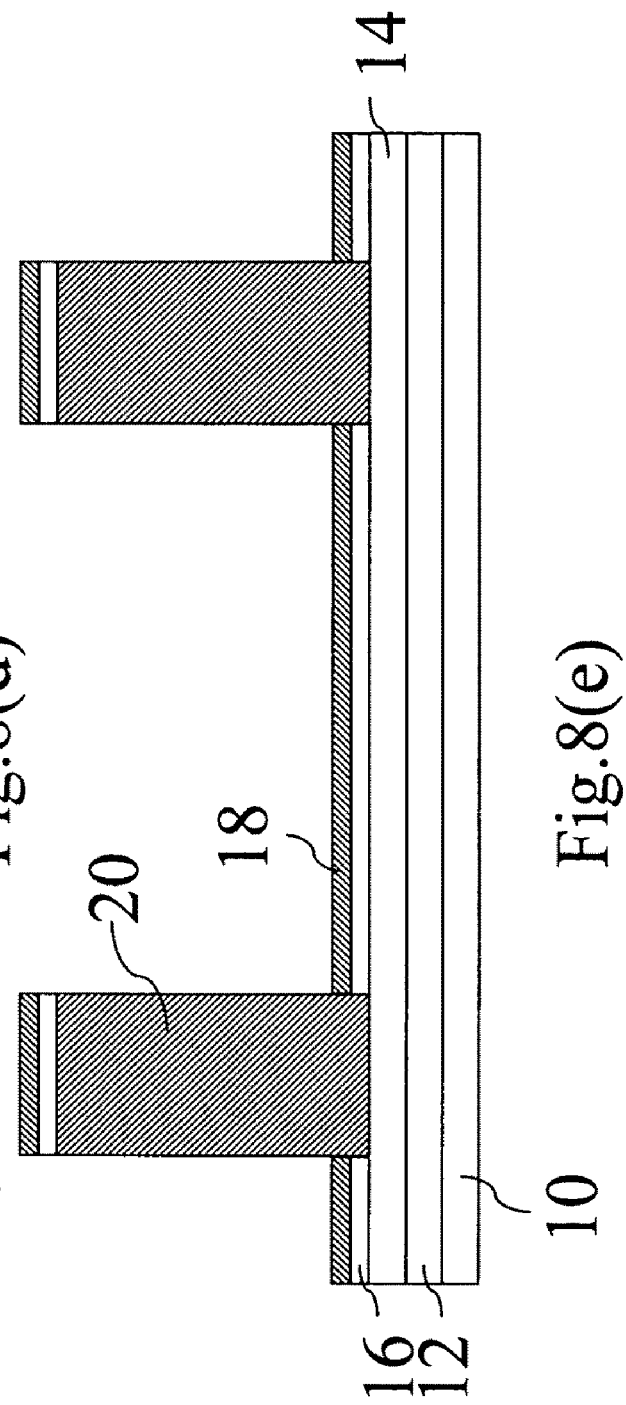

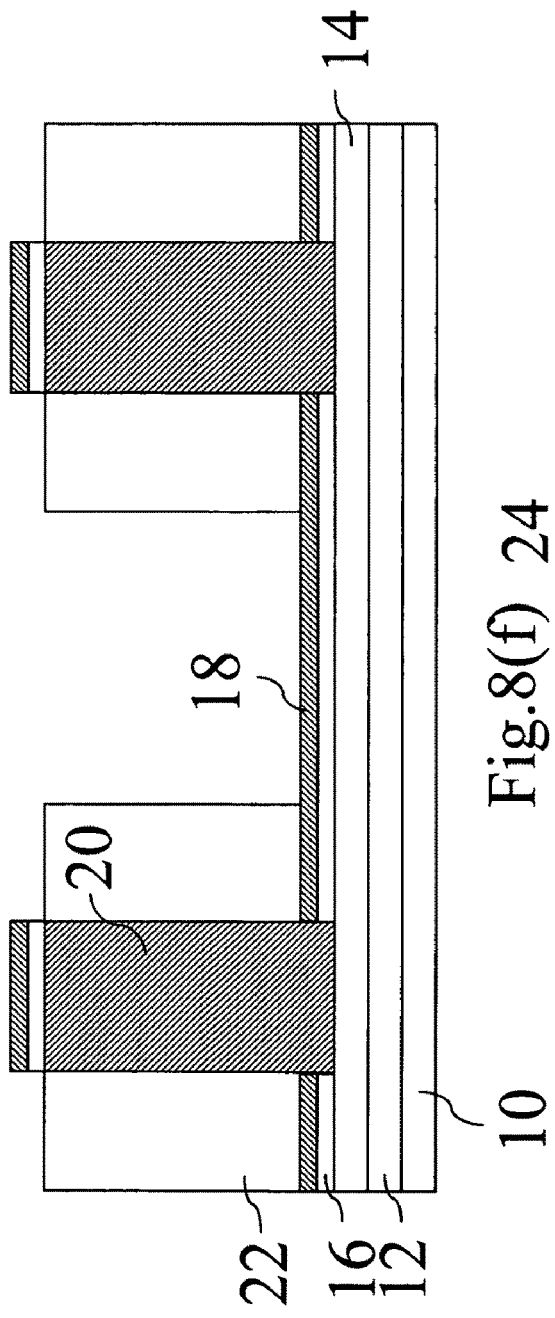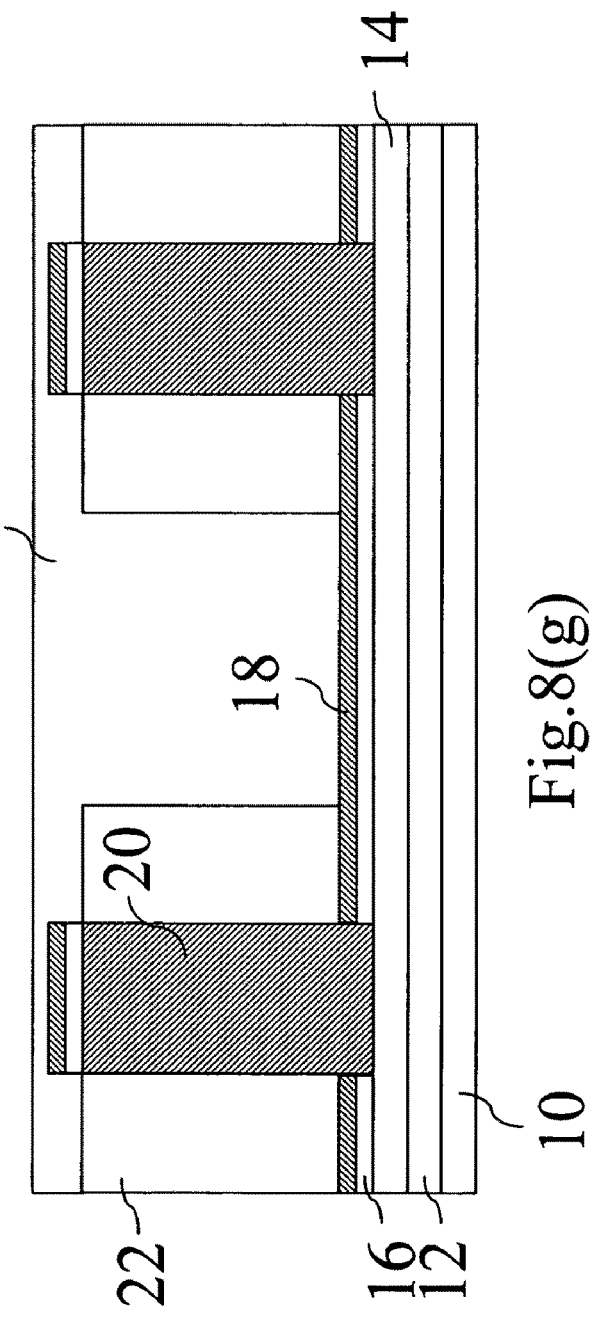

HIGH EFFICIENCY LIGHTING DEVICE AND METHOD FOR FABRICATING THE SAME

BACKGROUND OF THE INVENTION

1. Field of the Invention

The present invention relates to a lighting technology, particularly to a high-efficiency lighting device and a method for fabricating the same.

2. Description of the Related Art

The light emitting diode, abbreviated as LED, was usually used as the component of indicators or display panels before. Owing to technical advance, LED is also used as the light source now. LED can convert electric energy into light energy efficiently and has a service life of as long as tens to hundreds of hours. LED has nothing to do with the fragility of the traditional light bulb but has much higher power efficiency than the traditional light bulb. LED further has the following advantages over the traditional light bulb: environmental friendliness (mercury free), small size, low temperature, directivity, less light pollution, and abundant color gamut. Therefore, LED has a high potential to replace the traditional lighting devices. In the recent years, LED has been applied to daily living, such as house illuminators, backlight devices, street lights, and vehicle lights. LEDs made of different materials respectively emit different-color lights. For example, a quaternary InGaAlP LED emits yellow light, and a ternary GaAsP LED emits red light, and a binary GaN LED emits blue light.

GaN is a direct-gap semiconductor material having a wider energy band gap (about 3.48 ev) and a higher photoluminescence efficiency. GaN has been extensively studied by scientists recently. As early as in 1932, the GaN chip had been achieved with a high-temperature synthesis method by W. C. Johnson, et al. However, a larger-area GaN did not appear until 1962. In 1962, H. P. Muruska, et al., successfully grew a larger-area GaN epitaxial film on a sapphire substrate with a HVPE (Hydride Vapor Phase Epitaxy) technology and found GaN has a direct band gap of 3.4 ev. As there are crystalline mismatch (as high as 16.1%) and difference of thermal expansion coefficients between GaN and sapphire, GaN epitaxial film has a dislocation density of as high as $10^9$-$10^{10}/cm^2$, which is much higher than the dislocation densities of other nitride semiconductor materials. Therefore, a high-quality GaN epitaxial material was hard to obtain. Table.1 shows the lattice constants of common nitride semiconductor materials.

In 1983, S. Yoshida, et al., formed an aluminum nitride (AlN) layer as a buffer layer on an aluminum oxide substrate at a high temperature and then grew GaN on the aluminum nitride to obtain a higher-quality GaN crystal. In 1986, Amano, et al., (a research team of Professor Isamu Akasaki, Nagoya University) successfully grew a transparent and surface crack-free GaN film on a low-temperature AlN buffer layer with an MOCVD epitaxial technology. Later, Akasaki, et al., using X-ray diffraction spectrums and photoluminescence frequency spectrums, proved that the GaN film grown on the low-temperature buffer layer has perfect crystallinity, and that the concentration of the intrinsic defect-induced donors is reduced to $1\times10^{15}/cm^3$, and that electronic mobility is increased by a scale of 10. In 1992, Dr. Nakamura in Nichia Co. Japan, using an annealing technology, successfully activated the GaN film grown on the low-temperature buffer layer. In 1995, Nakamura successfully achieved a blue-light GaN LED and a green-light GaN LED. In 1996, Nakamura achieved a white-light LED, wherein a blue-light InGaN LED (with a wavelength of 460 nm-470 nm) is used to excite the yellow fluorescent material of YAG (yttrium-aluminum garnet): $Ce^{3+}$ with 5d-4f transition to obtain white light. Thereafter, the technology of nitride semiconductor materials expanded rapidly with the persistent development of the crystal-growth technology and the optoelectronic technology. Considering the vast field in illumination application, the blue-light LED, true-color LED and white-light LED are expected to continuously have great annual growth in the global market and finally achieve a dominant role in lighting instruments.

Owing to the patents, only few manufacturers can fabricate and sell blue-light LED epitaxial chips, such as Cree and LumiLeds in US and Nichia and Toyoda Gosei in Japan. The fact considerably impairs the endeavor of Taiwan companies to develop the market of blue-light LED. Besides, high price also impairs the popularization of blue-light LED. The high price of blue-light LED is partially attributed to the high price of the crystal-growth sapphire substrate. If a silicon substrate can be used as a crystal-growth substrate, the cost of blue-light LED will be effectively reduced. Thus, using a cheap silicon substrate to fabricate a high-quality LED epitaxial chip has become a problem the manufacturers have to overcome.

In the conventional technology for fabricating LED epitaxial chips, III-V group semiconductor materials are epitaxially grown on a substrate layer-by-layer. The conventional technology has the problem that the III-V group semiconductor materials have to match the substrate material in the crystalline structures thereof. Currently, the GaN LED epitaxial chips are usually grown on the sapphire substrate. As mentioned above, the two materials have crystalline mismatch (up to 16.1%) and difference of thermal expansion coefficients therebetween. Recently, many research teams have developed various technologies to solve abovementioned problems. However, most of the related patents are possessed by US or Japan manufacturers. Therefore, overthrowing the conventional LED epitaxial technologies and breaking through the existing patents are the problems the other manufacturers are eager to overcome.

Accordingly, the present invention proposes a high-efficiency lighting device and a method for fabricating the same to break through the bottleneck, whereby III-V group semiconductor materials can be grown on an arbitrary substrate in a high quality.

SUMMARY OF THE INVENTION

The primary objective of the present invention is to provide a high-efficiency lighting device and a method for fabricating the same, wherein a nitride layer is formed on the side walls of micro and nano structures of zinc oxide to fabricate a lighting device having a superior luminous efficiency.

Another objective of the present invention is to provide a high-efficiency lighting device and a method for fabricating the same, whereby an arbitrary substrate can be used to fabricate a high-efficiency lighting device, and whereby the fabrication cost can be greatly reduced.

To achieve the abovementioned objectives, the present invention proposes a high-efficiency lighting device, which comprises an insulation substrate; an electrode layer formed on the insulation substrate; a seed layer formed on the electrode layer; a plurality of first insulation units formed on the seed layer; a plurality of micro and nano structures of zinc oxide formed on the seed layer and each arranged between two neighboring first insulation units; a nitride layer formed on the side wall of each micro and nano structure of zinc oxide; and an electrode layer formed on each nitride layer.

The present invention also proposes a method for fabricating a high-efficiency lighting device, which comprises steps: providing an insulation substrate and sequentially forming an electrode layer and a seed layer on the insulation layer; forming a plurality of micro and nano structures of zinc oxide and a plurality of first insulation units on the seed layer, wherein each micro and nano structure of zinc oxide is arranged between two neighboring first insulation units; forming a nitride layer on the side wall of each micro and nano structure of zinc oxide; and forming an electrode layer on each nitride layer.

Below, the embodiments are described in detail in cooperation with the drawings to make easily understood the technical contents, characteristics and accomplishments of the present invention.

BRIEF DESCRIPTION OF THE DRAWINGS

FIGS. 2(a)-2(k) are sectional views schematically showing a method for fabricating the high-efficiency lighting device according to the first embodiment of the present invention;

FIGS. 4(a)-4(k) are sectional views schematically showing a method for fabricating the high-efficiency lighting device according to the second embodiment of the present invention;

FIGS. 6(a)-6(h) are sectional views schematically showing a method for fabricating the high-efficiency lighting device according to the third embodiment of the present invention;

FIG. 7 is a sectional view schematically showing a high-efficiency lighting device according to a fourth embodiment of the present invention;

FIGS. 8(a)-8(h) are sectional views schematically showing a method for fabricating the high-efficiency lighting device according to the fourth embodiment of the present invention;

DETAILED DESCRIPTION OF THE INVENTION

The spirit of the present invention is to integrate the crystal-growth process and the fabrication process, wherein a micro and nano structure of zinc oxide is used as the crystal-growth center. As shown in Table. 1, the lattice constants of zinc oxide and gallium nitride match each other considerably. Therefore, a lateral epitaxial growth technology is used to grow a high-quality nitride layer on a medium of zinc oxide to achieve a novel lighting device, wherein a column structure replaces the conventional layer-by-layer structure. The lighting device may be a light emitting diode or a laser diode.

TABLE 1

| Material | Lattice Constants |
| --- | --- |
| GaN | a = 3.189, c = 5.185 |
| ZnO | a = 3.252, c = 5.313 |
| Sapphire | a = 4.748, c = 12.97 |

Figure 1:
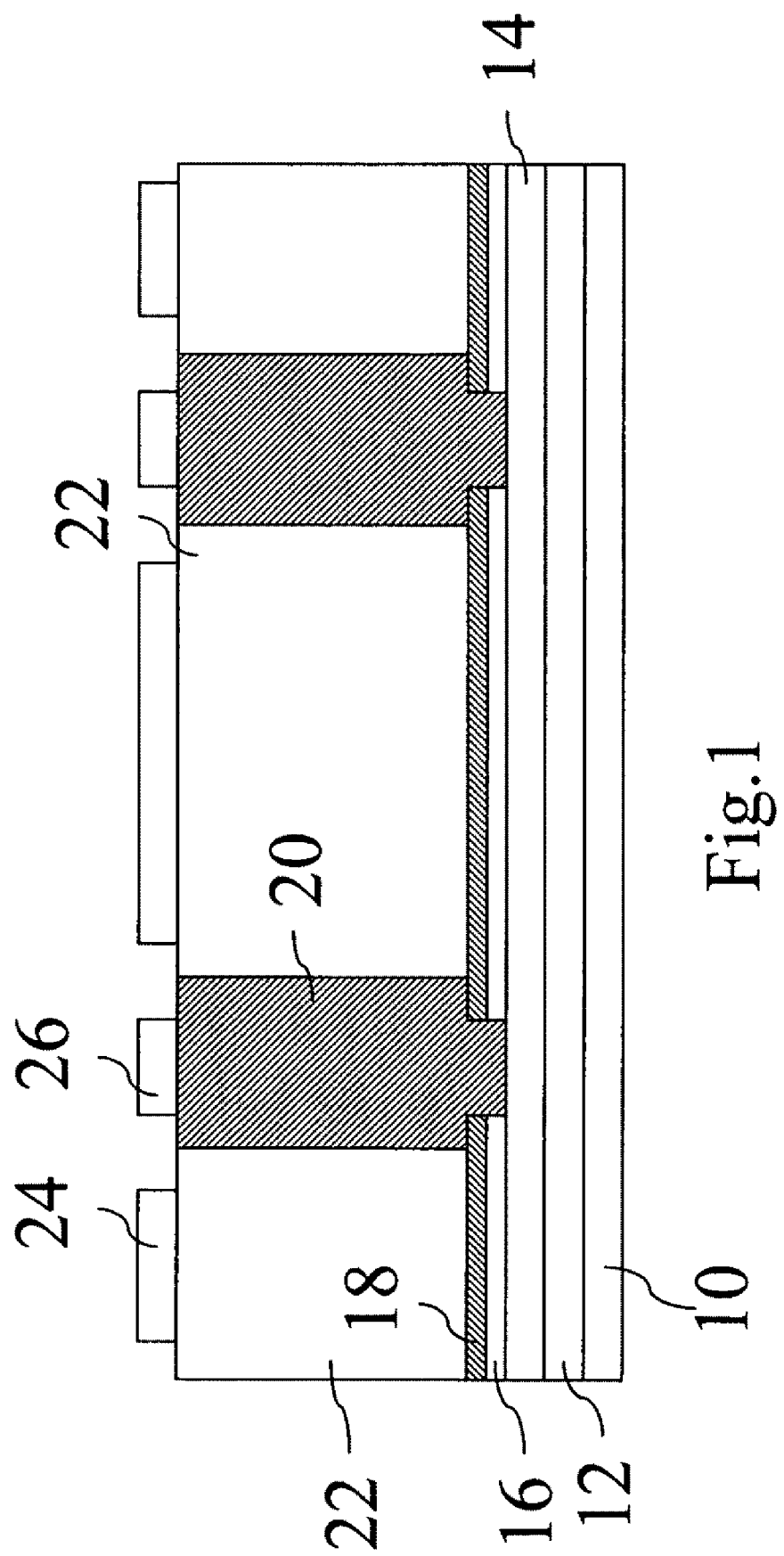
FIG. 1 is a sectional view schematically showing a high-efficiency lighting device according to a first embodiment of the present invention.

Refer to FIG. 1 for a first embodiment of the present invention. In this embodiment, the lighting device of the present invention comprises an insulation substrate 10; an electrode layer 12 formed on the insulation substrate 10; a seed layer 14 formed on the electrode layer 12; a plurality of first insulation units 18 formed on the seed layer 14; a plurality of micro and nano structures of zinc oxide 20 formed on the seed layer 14, each arranged between two neighboring first insulation units 18 and covering parts of the two neighboring first insulation units 18; a nitride layer 22 formed on the side wall of each micro and nano structure of zinc oxide 20; an electrode layer 24 formed on each nitride layer 22 and covering a part of the nitride layer 22, wherein the nitride layers 22 fill up the space between two neighboring micro and nano structures of zinc oxide 20 and jointly use an identical electrode layer 24.

The current flows from the electrode layer 24, through the nitride layer 22, the micro and nano structure of zinc oxide 20 between two neighboring first insulation units 18, to the electrode layer 12 and then flows out from the electrode layer 12. To project the light unidirectionally, a metal layer 16 is arranged between the first insulation unit 18 and the seed layer 14, and the electrode layer 24 adopts a transparent conductive material. When the light is projected downward, the metal layer 16 reflects back the light to pass through the transparent electrode layer 24. Further, a second insulation unit 26 is formed on the micro and nano structure of zinc oxide 20 to protect the micro and nano structure of zinc oxide 20 from the external environment.

When either the second insulation unit 26 or the metal layer 16 is omitted, or even when both the second insulation unit 26 and the metal layer 16 are omitted, the light device of the present invention can still work well. When the metal layer 16 is omitted, the first insulation units 18 are directly formed on the seed layer 16, and each micro and nano structure of zinc oxide 20 is arranged between two neighboring first insulation units 18.

Besides, a conductive substrate, such as a silicon substrate, can replace the insulation substrate 10 and the electrode layer 12, and the seed layer 14 is thus directly formed on the conductive substrate.

The metal layer 16 may be made of gold or silver. The micro and nano structure of zinc oxide 20 may be made of a P-type or N-type zinc oxide. The insulation substrate 10 may be made of sapphire, a glass, or a plastic. The seed layer 14 may be made of zinc oxide, gold, tin, or cobalt. The electrode layers 12 and 24 may be made of gold, silver, nickel, aluminum, platinum, ITO (Indium Tin Oxide), GITO (Gallium Indium Tin Oxide), ZITO (Zinc Indium Tin Oxide), FTO (Fluorine-doped Tin Oxide), zinc oxide, AZO (Aluminum Zinc Oxide), or IZO (Indium Zinc Oxide). The first and second insulation units 18 and 26 may be made of PMMA (poly(methyl methacrylate)), SOG (Spin-On Glass), silicon dioxide ($SiO_2$), or silicon nitride ($Si_3N_4$).

The micro and nano structure of zinc oxide 20 may have a shape of a column, a cone, a parallelepiped, or a hexagonal prism. The micro and nano structure of zinc oxide 20 has a height of 30 nm-10 μm. Under the condition of an identical diameter of the section, the higher the micro and nano structure of zinc oxide 20, the greater the brightness. The micro and nano structures of zinc oxide 20 may be separated equidistantly with a spacing therebetween ranging from 10 nm to 1000 μm.

The nitride layer 22 may be made of a nitride semiconductor material or a nitride quantum well structure. The nitride semiconductor material may be gallium nitride, indium gallium nitride, aluminum gallium nitride, or aluminum gallium indium nitride. The nitride quantum well structure may be an indium gallium nitride quantum well structure.

Figure 2D:
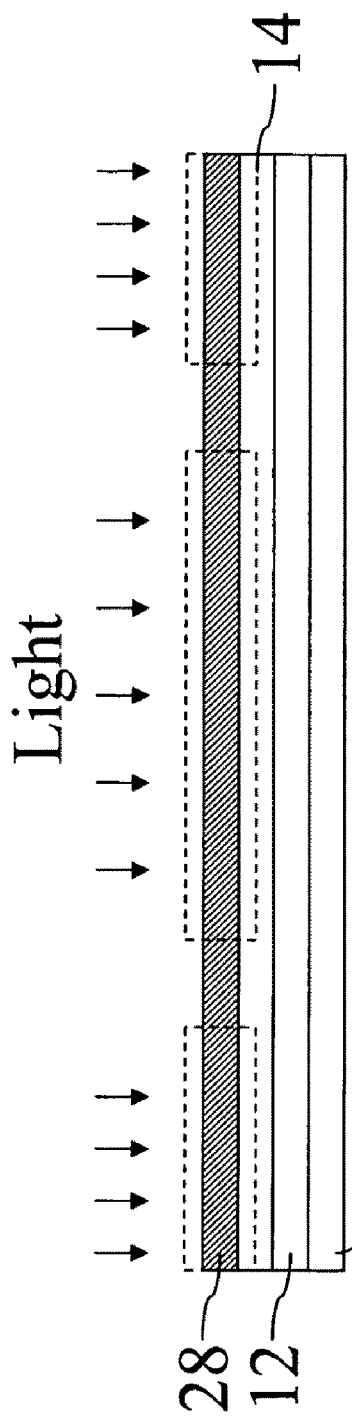
Figure 2E:
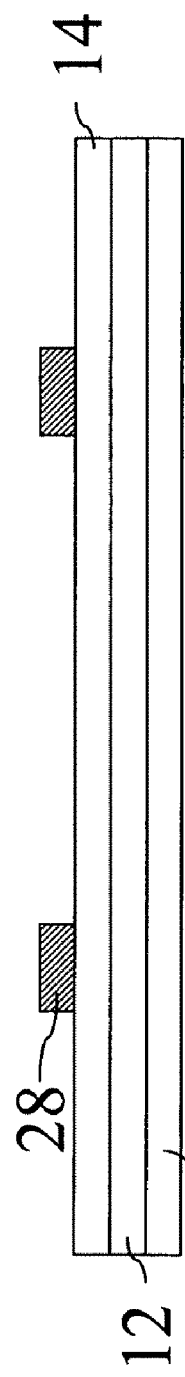

Refer to FIGS. 2(a)-2(k) for the method to fabricate the high-efficiency lighting device of the first embodiment. As shown in FIG. 2(a), an insulation substrate 10 is provided firstly. As shown in FIG. 2(b), an electrode layer 12 is formed on the insulation substrate 10. As shown in FIG. 2(c), a seed layer 14 id formed on the electrode layer 12. When the seed layer 14 is made of zinc oxide, the seed layer 14 may be fabricated with a spin-coating method, a dip-coating method, an evaporation method, a sputtering method, an atomic layer deposition method, an electrochemical deposition method, a pulsed laser deposition method, or an MOCVD (Metal Organic Chemical Vapor Deposition) method. When the seed layer 14 is made of gold, tin or cobalt, the seed layer 14 may be fabricated with a vapor deposition method or a sputtering method. When the seed layer 14 is made of gold, the seed layer 14 may also be fabricated via applying the gold micro/nanoparticles suspended in a solution onto the substrate with spin-coating method or a dip-coating method, or annealing the gold film into gold micro/nanoparticles at a high temperature.

Figure 2F:
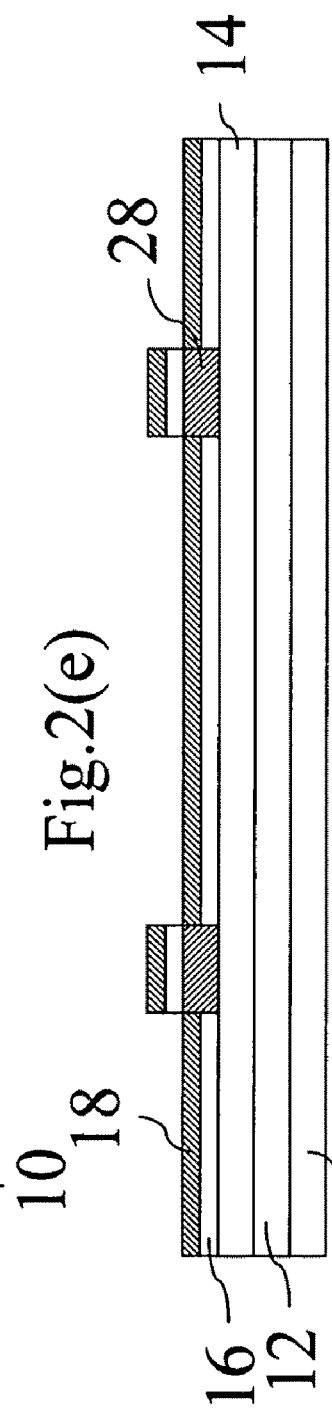
Figure 2J:
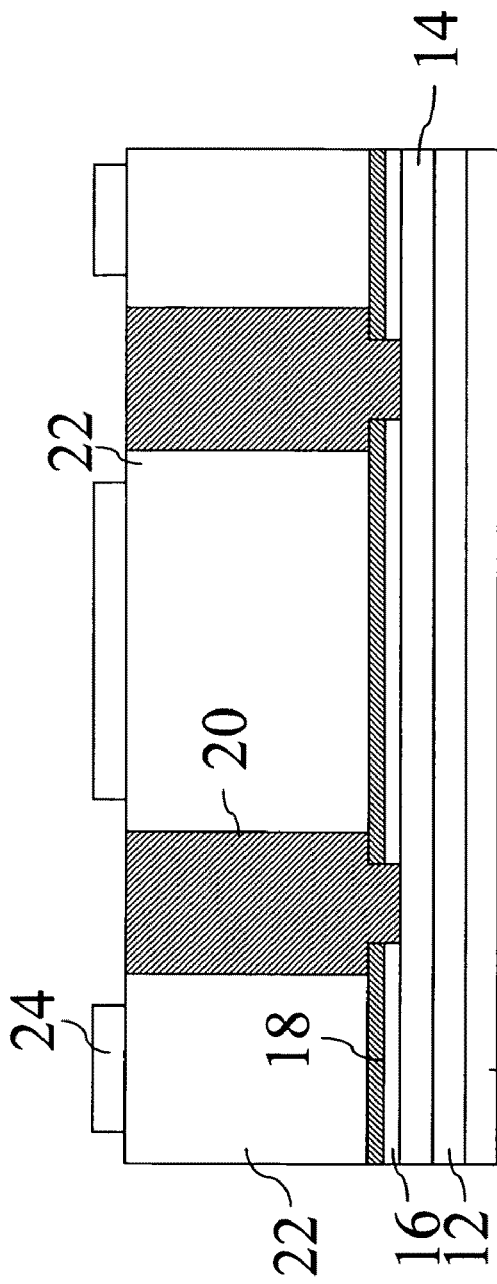
Figure 2K:
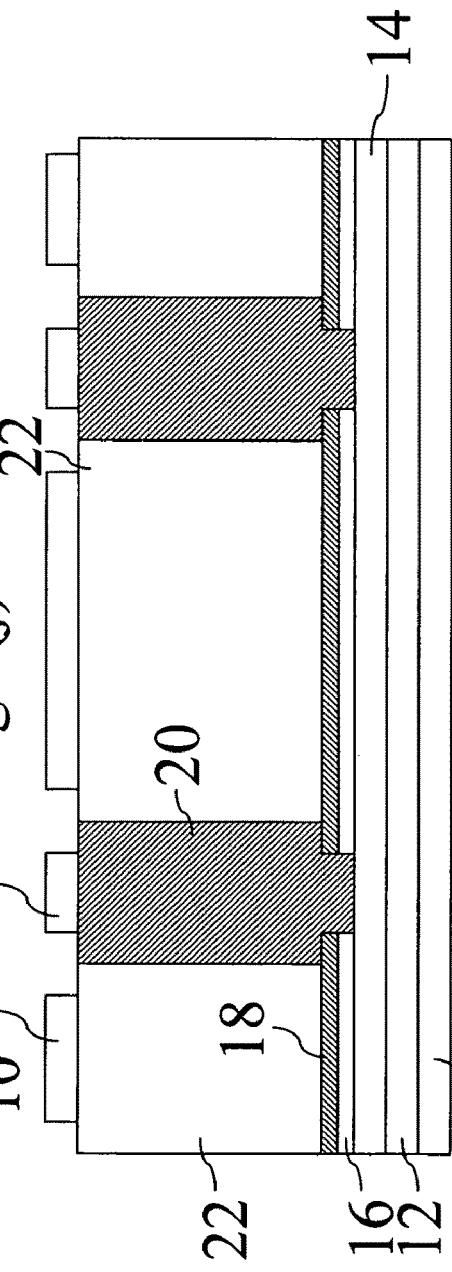

Refer to FIG. 2(d). After the seed layer 14 has been formed, a photoresist layer 28 is coated on the seed layer 14, and then a portion of the photoresist layer 28 is removed with a photolithographic method to obtain the structure shown in FIG. 2(e). Next, as shown in FIG. 2(f), a metal layer 16 and a first insulation unit 18 are sequentially formed on the seed layer 16 and the photoresist layer 28. Next, as shown in FIG. 2(g), the metal layer 16 and the first insulation unit 18 both exactly over the photoresist layer 28 together with the photoresist layer 28 are removed, whereby the single first insulation unit 18 is multiplied into a plurality of first insulation units 18. Next, as shown in FIG. 2(h), a plurality of micro and nano structures of zinc oxide 20 is formed over the seed layer 14, and each micro and nano structure of zinc oxide 20 is arranged between two neighboring first insulation units 18 and covers parts of the two neighboring first insulation units 18. The micro and nano structures of zinc oxide 20 may be fabricated with a hydrothermal method, a thermal evaporation method, a CVD (Chemical Vapor Deposition) method, a molecular beam epitaxy method, an AAO (Anodic Aluminum Oxide) method, or an electrochemical method. The top surface of the micro and nano structure of zinc oxide 20 is a polarized surface, but the side walls of the micro and nano structures of zinc oxide 20 are non-polarized surfaces. Next, as shown in FIG. 2(i), high-quality nitride layers 22 are respectively formed on the side walls of the micro and nano structures of zinc oxide 20, and the high-quality nitride layers 22 fill up the space between the two neighboring micro and nano structures of zinc oxide 20. The high-quality nitride layers 22 are fabricated with a molecular beam epitaxy method, an MOCVD (Metal Organic Chemical Vapor Deposition) method, or a liquid phase epitaxy method. Next, as shown in FIG. 2(j), a photolithographic method is used to define special areas on the top surfaces of the nitride layers 22, and electrode layers 24 are respectively formed on the special areas, wherein the nitride layers 22 between two neighboring micro and nano structures of zinc oxide 20 jointly use a common electrode layer 24. Next, as shown in FIG. 2(k), a photolithographic method is used to define special areas on the top surfaces of the micro and nano structures of zinc oxide 20, and second insulation units 26 are respectively formed on the special areas over the micro and nano structures of zinc oxide 20. Thus is completed the lighting device of the present invention.

In the steps shown in FIGS. 2(a) and 2(b), a conductive substrate may replace the insulation substrate 10 and the electrode layer 12; the seed layer 14 is thus directly formed on the conductive substrate in the step shown in FIG. 2(c).

If the metal layer 16 is to be omitted from the lighting device of the present invention, the sub-step of forming the metal layer 16 is omitted from the step shown in FIG. 2(f), and only the first insulation unit 18 is formed on the seed layer 14. If the second insulation units are to be omitted from the lighting device of the present invention, the step shown in FIG. 2(k) is omitted.

Figure 3:
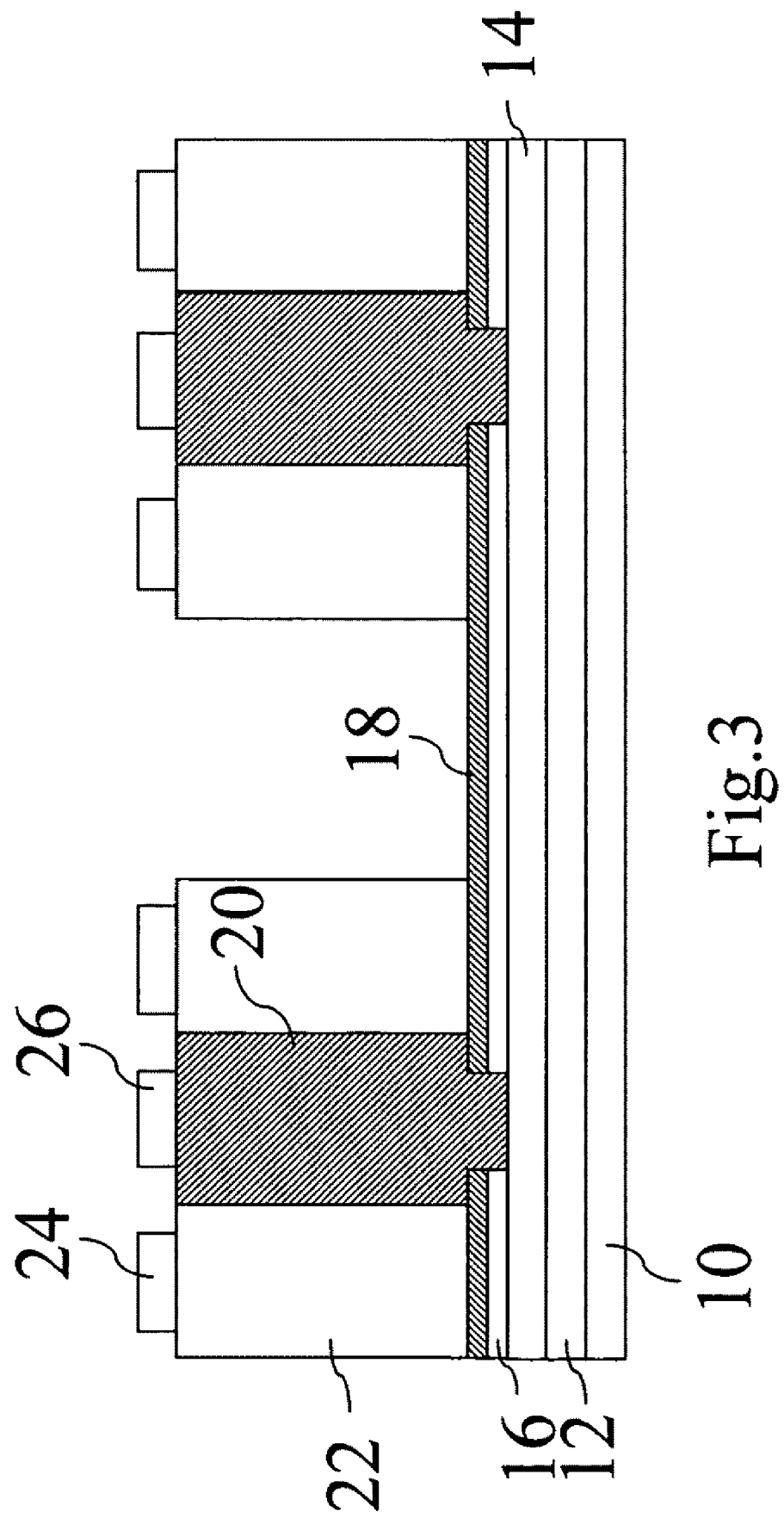
FIG. 3 is a sectional view schematically showing a high-efficiency lighting device according to a second embodiment of the present invention.

Refer to FIG. 3 for a second embodiment of the present invention. The second embodiment is different from the first embodiment in that the nitride layers 22 do not fill up the space between two neighboring micro and nano structures of zinc oxide 20. Thus, each nitride layer 22 on the side wall of the micro and nano structure of zinc oxide 20 has its own electrode layer 24. Contrarily in the first embodiment, the nitride layers 22 fill up the space between the two neighboring micro and nano structures of zinc oxide 20, and the nitride layers 22 between two neighboring micro and nano structures of zinc oxide 20 jointly use a common electrode layer 24.

Refer to FIGS. 4(a)-4(k) for the method to fabricate the high-efficiency lighting device of the second embodiment. The steps shown in FIGS. 4(a)-4(h) are similar to the steps shown in FIGS. 2(a)-2(h) and will not repeat herein. Next, as shown in FIG. 4(i), high-quality nitride layers 22 are respectively formed on the side walls of the micro and nano structures of zinc oxide, but the high-quality nitride layers 22 do not fill up the space between the two neighboring micro and nano structures of zinc oxide 20. The steps shown in FIGS. 4(j)-4(k) are also similar to the steps shown in FIGS. 2(j)-2(k) and will not repeat herein. Then, as shown in FIG. 4(k), the nitride layers 22 do not fill up the space between two neighboring micro and nano structures of zinc oxide 20, and each nitride layer 22 on the side wall of the micro and nano structure of zinc oxide 20 has its own electrode layer 24.

Figure 5:
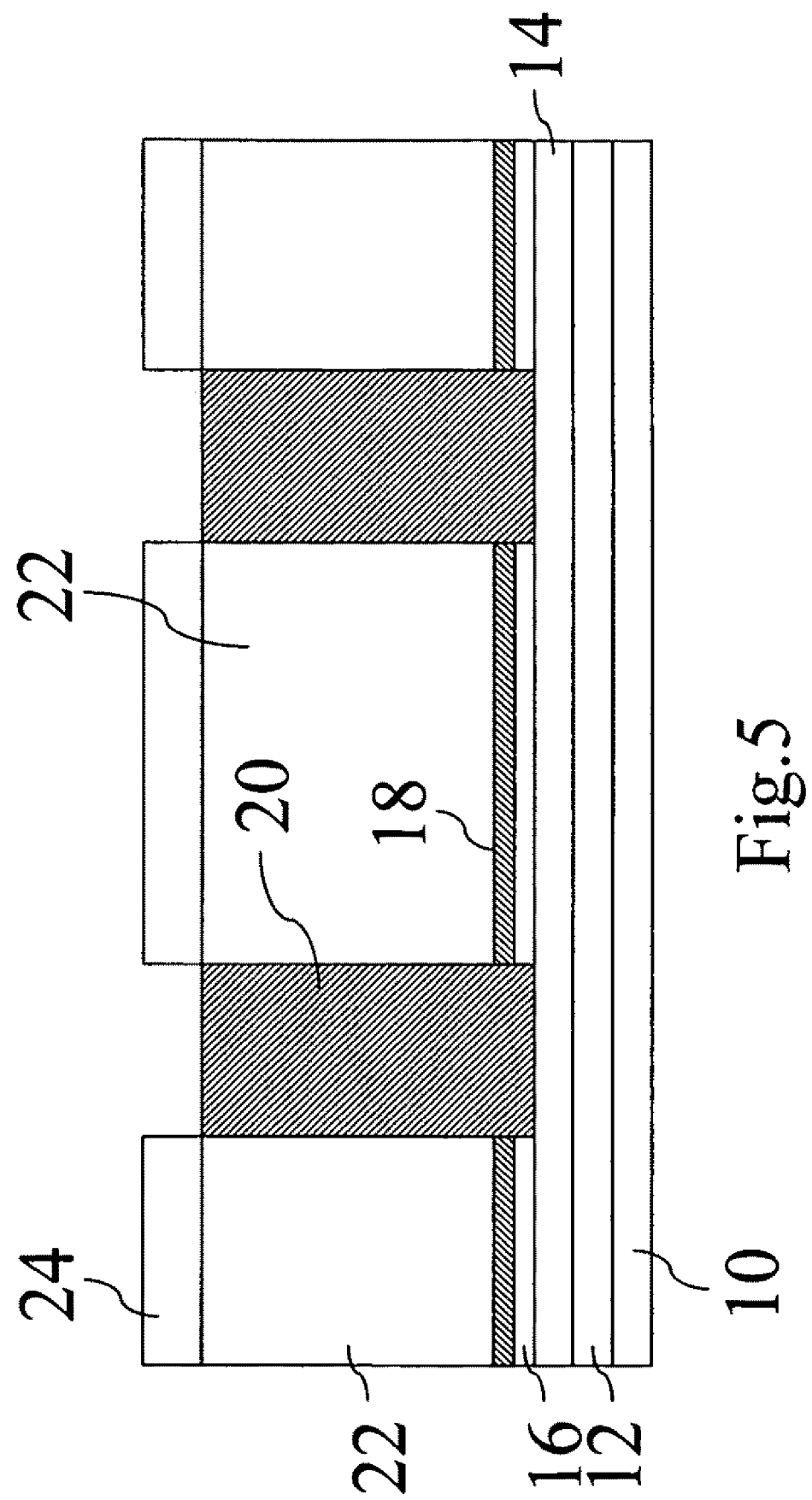
FIG. 5 is a sectional view schematically showing a high-efficiency lighting device according to a third embodiment of the present invention.

Refer to FIG. 5 for a third embodiment of the present invention. The third embodiment is different from the first embodiment in that none insulation unit is formed on the top surface of the micro and nano structure of zinc oxide 20, and that none micro and nano structure of zinc oxide 20 covers the first insulation units 18, and that the electrode layer 24 covers the nitride layer 22 completely.

In the third embodiment, the electrode layer 24 may also be designed to only partially cover the nitride layer 22. In such a case, the high-efficiency lighting device of present invention also works well.

The fabrication method used in the first embodiment may also be used to fabricate the structure of the third embodiment. Refer to FIGS. 2(a)-2(k) again. However, in the step shown in FIG. 2(h), the width of the micro and nano structure of zinc oxide 20 is adjusted to be equal to the distance between two neighboring first insulation units 18 lest the micro and nano structure of zinc oxide 20 cover the first insulation units 18. Further, in the step shown in FIG. 2(j), the area of the electrode layer 24 is adjusted to completely cover the nitride layer 22. Furthermore, the step shown in FIG. 2(k) is omitted. Thus is completed the structure of the third embodiment.

If the electrode layers 24 are to be revised to cover parts of the nitride layers 22 in the third embodiment, only modifying the steps shown in FIG. 2(h) and FIG. 2(k) is sufficient to achieve the revision.

Figure 6A:
Figure 6B:
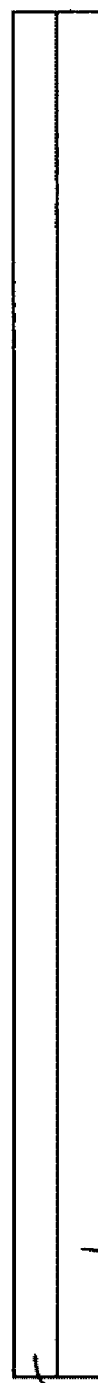
Figure 6C:
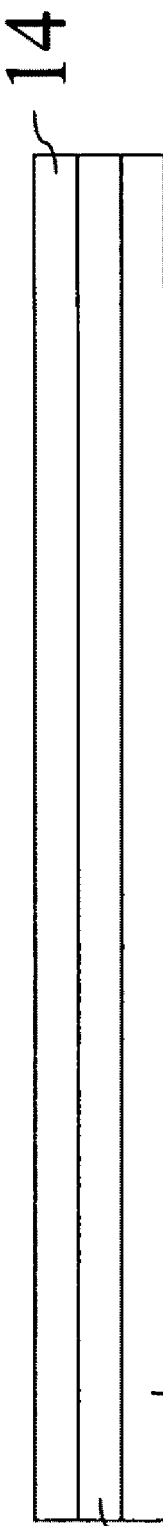

Refer to FIGS. 6(a)-6(h) for another method to fabricate the high-efficiency lighting device of the third embodiment. The steps shown in FIGS. 6(a)-6(c) are similar to the steps shown in FIGS. 2(a)-2(c) and will not repeat herein. Next, as shown in FIG. 6(d), a plurality of micro and nano structures of zinc oxide 20 is directly formed on the seed layer 14. Next, as shown in FIG. 6(e), a metal layer 16 and a first insulation unit 18 are sequentially formed over the seed layer 14 and the micro and nano structures of zinc oxide 20, whereby the micro and nano structures of zinc oxide 20 will not cover the first insulation units 18. Next, as shown in FIG. 6(f), high-quality nitride layers 22 are respectively formed on the side walls of the micro and nano structures of zinc oxide 20, and the nitride layers 22 fill up the space between two neighboring micro and nano structures of zinc oxide 20. Next, as shown in FIG. 6(g), an electrode layer 24 is formed over the nitride layers 22 to completely cover the nitride layers 22 and the first insulation units 18 on the top surfaces of the zinc oxide structures 20. Next, as shown in FIG. 6(h), the metal layers 16, the first insulation units 18 and the electrode layer 24 exactly above the micro and nano structures of zinc oxide 20 are removed, whereby the nitride layers 22 between two neighboring micro and nano structures of zinc oxide 20 jointly use a common electrode layer 24. Thus is completed the structure of the third embodiment.

Refer to FIG. 7 for a fourth embodiment of the present invention. The fourth embodiment is different from the third embodiment in that it is not the nitride layer 22 but the electrode layer 24 that fills up the space between two neighboring micro and nano structures of zinc oxide 20.

Figure 8A:
Figure 8B:
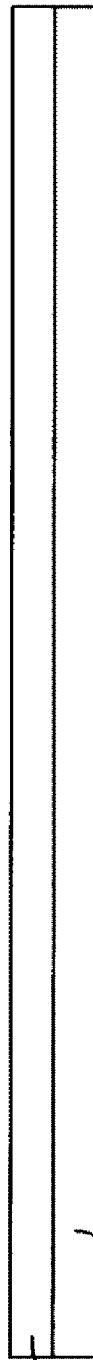
Figure 8C:
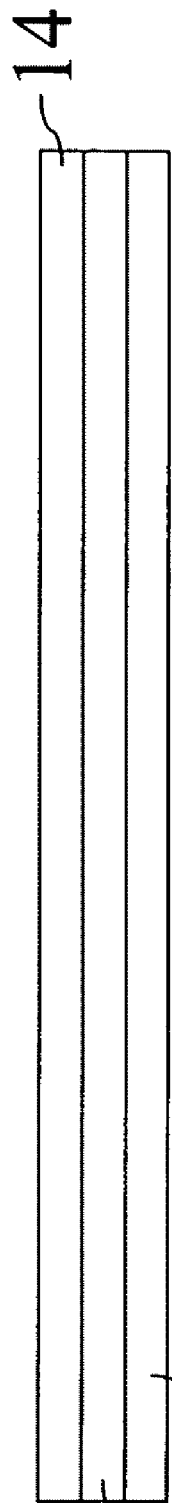
Figure 8H:
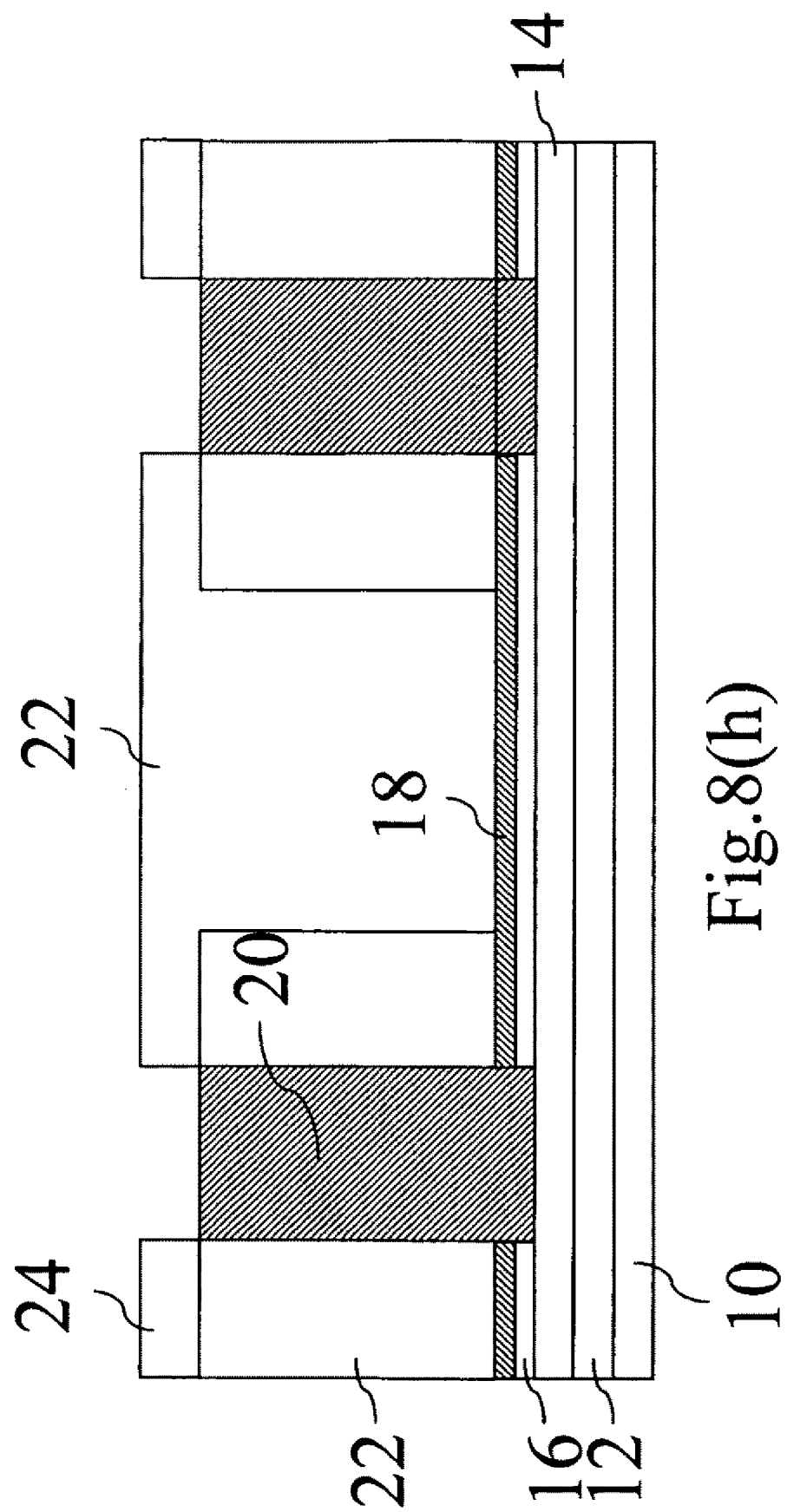

Refer to FIGS. 8(a)-8(h) for the method to fabricate the high-efficiency lighting device of the fourth embodiment. The steps shown in FIGS. 8(a)-8(e) are similar to the steps shown in FIGS. 6(a)-6(e) and will not repeat herein. Next, as shown in FIG. 8(f), high-quality nitride layers 22 are respectively formed on the side walls of the micro and nano structures of zinc oxide 20, but the nitride layers 22 do not fill up the space between the micro and nano structures of zinc oxide 20. Next, as shown in FIG. 8(g), an electrode layer 24 is formed over the nitride layers 24 to completely cover the nitride layers 22 and the first insulation units 18 on the micro and nano structures of zinc oxide 20 and fill up the space between two neighboring micro and nano structures of zinc oxide 20. Next, as shown in FIG. 8(h), the metal layers 16, the first insulation units 18 and the electrode layer 24 exactly above the micro and nano structures of zinc oxide 20 are removed. As the electrode layers 24 fill up the spaces between two neighboring micro and nano structures of zinc oxide 20, the nitride layers 22 between two neighboring micro and nano structures of zinc oxide 20 still jointly use a common electrode layer 24. Thus is completed the structure of the fourth embodiment.

Figure 9:
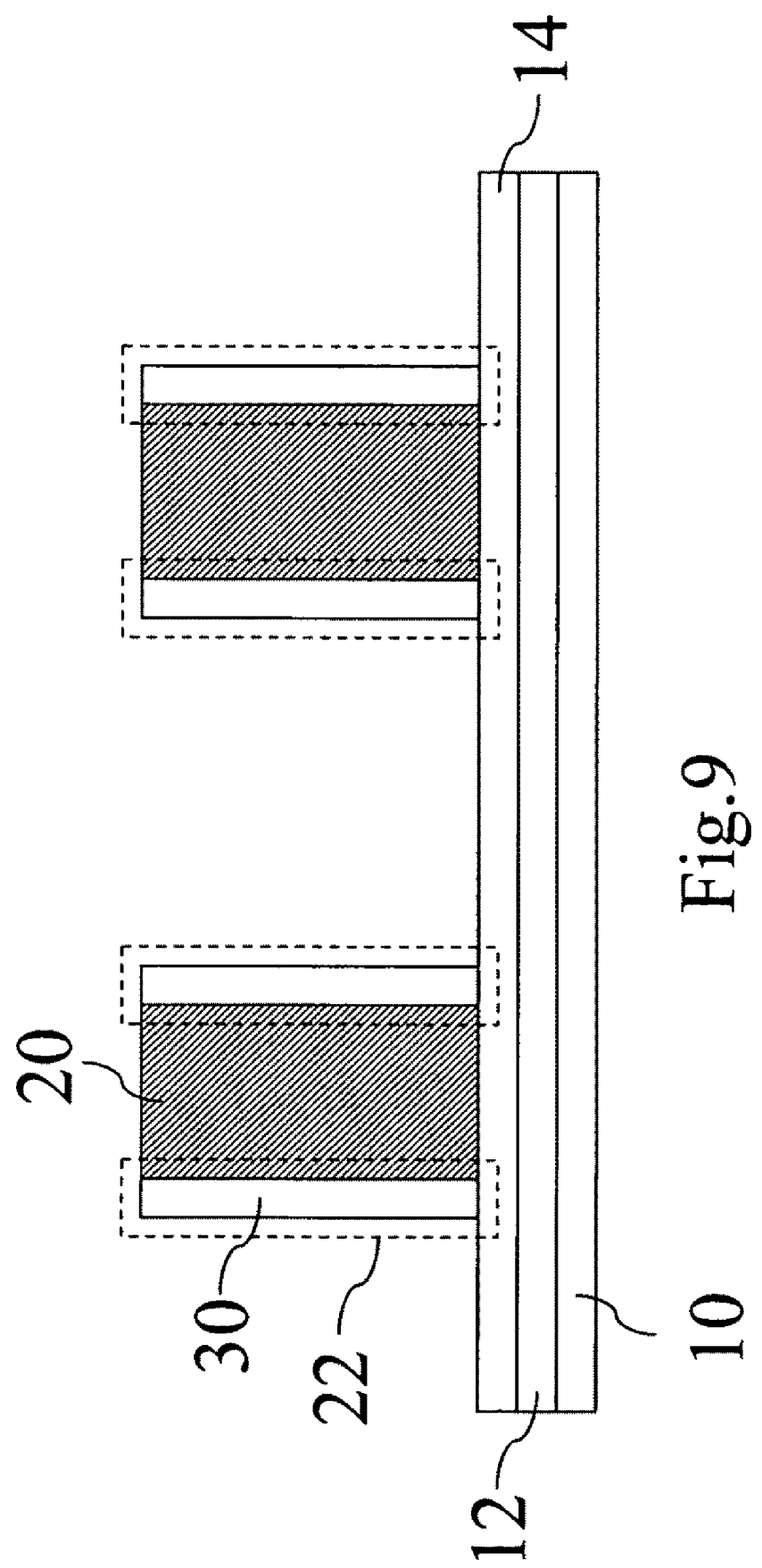
FIG. 9 is a sectional view schematically showing a first embodiment of the nitride layer according to the present invention.
Figure 10:
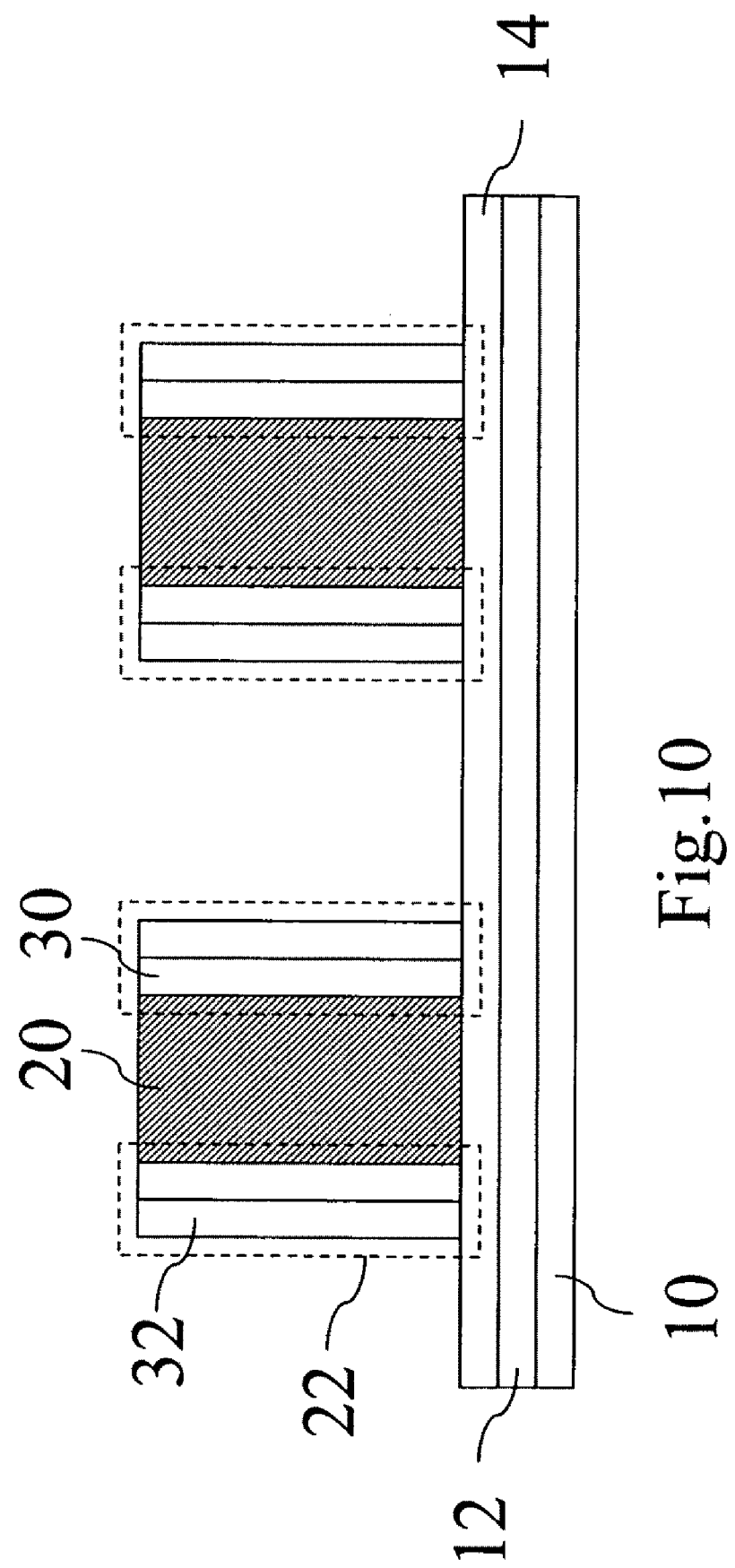
FIG. 10 is a sectional view schematically showing a second embodiment of the nitride layer according to the present invention.
Figure 11:
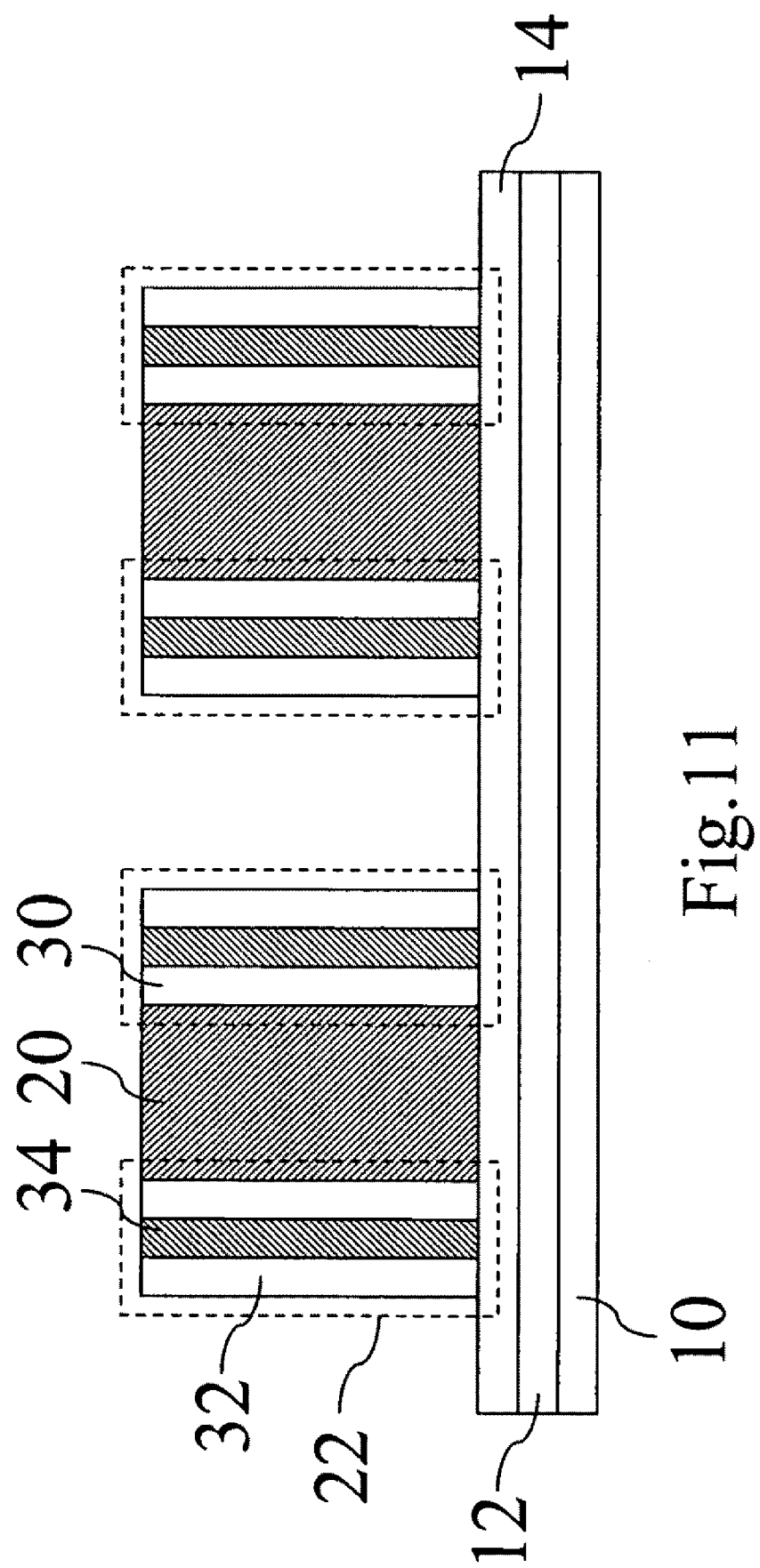
FIG. 11 is a sectional view schematically showing a third embodiment of the nitride layer according to the present invention.

The nitride layer in the abovementioned embodiments has three its own embodiments, which are respectively shown in the following three drawings. As shown in FIG. 9, the nitride layer 22 on the insulation substrate 10 has only one layer of nitride semiconductor crystal 30, and the nitride semiconductor crystal 30 may be a P-type or N-type nitride semiconductor crystal. As shown in FIG. 10, the nitride layer 22 on the insulation substrate 10 has a stacked two-layer structure containing one layer of nitride semiconductor crystal 30 and one layer of nitride semiconductor crystal 32; when the nitride semiconductor crystal 30 is of a P (N)-type conduction, the nitride semiconductor crystal 32 is of an N (P)-type conduction. As shown in FIG. 11, the nitride layer 22 on the insulation substrate 10 has a stacked three-layer structure containing one layer of nitride semiconductor crystal 30, one layer of nitride quantum well structure 34 and one layer of nitride semiconductor crystal 32 in sequence; when the nitride semiconductor crystal 30 is of a P (N)-type conduction, the nitride semiconductor crystal 32 is of an N (P)-type conduction.

Figure 12:
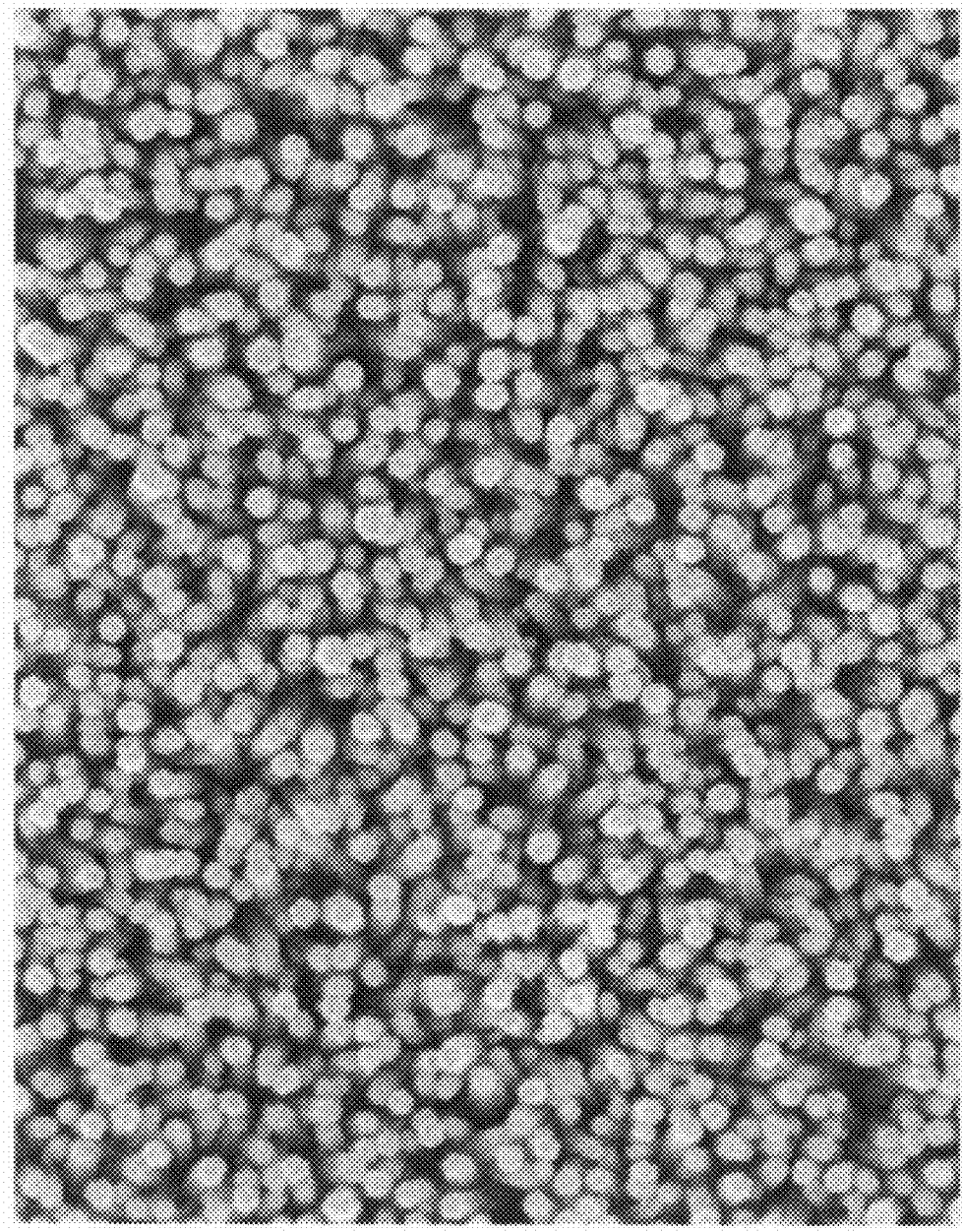
FIG. 12 is an SEM photograph of a micro and nano structure of zinc oxide grown with a hydrothermal method according to the present invention.

Refer to FIG. 12 for an SEM (Scanning Electron Microscope) photograph of a micro and nano structure of zinc oxide grown with a hydrothermal method. As shown in FIG. 12, the micro and nano structure of zinc oxide has a column shape.

In conclusion, the present invention achieves a high-efficiency lighting device and reduces the fabrication cost thereof via growing nitride layers on the side walls of micro and nano structures of zinc oxide formed on an arbitrary substrate. Therefore, the present invention is a very useful innovation.

What is claimed is:

1. A method for fabricating a high-efficiency lighting device comprising steps:

providing a conductive substrate and forming a seed layer on said conductive substrate;

forming a plurality of micro and nano structures of zinc oxide and a plurality of first insulation units, wherein each said micro and nano structure of zinc oxide is arranged between two neighboring said first insulation units;

forming a nitride layer on each side wall of each said micro and nano structure of zinc oxide; and forming a first electrode layer on a surface of each said nitride layer.

2. The method for fabricating a high-efficiency lighting device according to claim 1, wherein said step of providing a conductive substrate includes steps:

providing an insulation substrate; and forming a second electrode layer on said insulation substrate, wherein said seed layer is formed on said second electrode layer.

3. The method for fabricating a high-efficiency lighting device according to claim 1, wherein second insulation units are respectively formed on said micro and nano structures of zinc oxide; said first insulation units and said second insulation units are made of PMMA (poly(methyl methacrylate)), SOG (Spin-On Glass), silicon dioxide ($SiO_2$), or silicon nitride ($Si_3N_4$).

4. The method for fabricating a high-efficiency lighting device according to claim 1, wherein a metal layer is formed between said first insulation units and said seed layer.

5. The method for fabricating a high-efficiency lighting device according to claim 1, wherein said nitride layer fills up a space between two neighboring said micro and nano structures of zinc oxide.

6. The method for fabricating a high-efficiency lighting device according to claim 1, wherein in said step of forming said micro and nano structures of zinc oxide and said first insulation units, said micro and nano structures of zinc oxide are formed before said first insulation units are formed.

7. The method for fabricating a high-efficiency lighting device according to claim 1, wherein in said step of forming said micro and nano structures of zinc oxide and said first insulation units, said first insulation units are formed before said micro and nano structures of zinc oxide are formed.

8. The method for fabricating a high-efficiency lighting device according to claim 1, wherein said first electrode layer partially or completely covers said nitride layers.

9. The method for fabricating a high-efficiency lighting device according to claim 1, wherein said micro and nano structures of zinc oxide are arranged equidistantly.

10. The method for fabricating a high-efficiency lighting device according to claim 1, wherein said micro and nano structure of zinc oxide is made of a P-type zinc oxide or an N-type zinc oxide; said conductive substrate is made of silicon; said seed layer is made of zinc oxide, gold, tin, or cobalt.

11. The method for fabricating a high-efficiency lighting device according to claim 1, wherein said nitride layer is made of a nitride semiconductor material or a nitride quantum well structure; said nitride semiconductor material is gallium nitride, indium gallium nitride, aluminum gallium nitride, or aluminum gallium indium nitride; said nitride quantum well structure is an indium gallium nitride quantum well structure.

12. The method for fabricating a high-efficiency lighting device according to claim 1, wherein said micro and nano structure of zinc oxide has a shape of a column, a cone, a parallelepiped, or a hexagonal prism.

13. The method for fabricating a high-efficiency lighting device according to claim 1, wherein said micro and nano structures of zinc oxide are fabricated with a hydrothermal method, a thermal evaporation method, a CVD (Chemical Vapor Deposition) method, a molecular beam epitaxy method, an AAO (Anodic Aluminum Oxide) method, or an electrochemical method; said nitride layers are fabricated with a molecular beam epitaxy method, an MOCVD (Metal Organic Chemical Vapor Deposition) method, or a liquid phase epitaxy method.

14. The method for fabricating a high-efficiency lighting device according to claim 2, wherein said insulation substrate is made of sapphire, a glass, or a plastic; said first electrode layer and said second electrode layer is made of gold, silver, nickel, aluminum, platinum, ITO (Indium Tin Oxide), GITO (Gallium Indium Tin Oxide), ZITO (Zinc Indium Tin Oxide), FTO (Fluorine-doped Tin Oxide), zinc oxide, AZO (Aluminum Zinc Oxide), or IZO (Indium Zinc Oxide).

15. The method for fabricating a high-efficiency lighting device according to claim 6, wherein said first electrode layer fills up a space between two neighboring said nitride layers.

16. The method for fabricating a high-efficiency lighting device according to claim 7, wherein said micro and nano structure of zinc oxide covers a portion of surfaces of said first insulation units.

17. The method for fabricating a high-efficiency lighting device according to claim 10, wherein when said seed layer is made of zinc oxide, said seed layer is fabricated with a spin-coating method, a dip-coating method, an evaporation method, a sputtering method, an atomic layer deposition method, an electrochemical deposition method, a pulsed laser deposition method, or an MOCVD (Metal Organic Chemical Vapor Deposition) method; when said seed layer is made of gold, tin or cobalt, said seed layer is fabricated with a vapor deposition method or a sputtering method.

18. A high-efficiency lighting device comprising
a conductive substrate;
a seed layer formed on said conductive substrate;
a plurality of first insulation units formed on said seed layer;
a plurality of micro and nano structures of zinc oxide formed on said seed layer and each arranged between two neighboring said first insulation units;
a nitride layer formed on a side wall of each said micro and nano structure of zinc oxide; and
a first electrode layer formed on a surface of each said nitride layer.

19. The high-efficiency lighting device according to claim 18, wherein said micro and nano structure of zinc oxide has a height of 10 nm-50 μm and a sectional diameter of 30 nm-10 μm; a spacing between two said neighboring micro and nano structures of zinc oxide is from 10 nm to 1000 μm.

20. The high-efficiency lighting device according to claim 18, wherein said conductive substrate includes
an insulation substrate; and
a second electrode layer formed on said insulation substrate, and said seed layer is formed on said second electrode layer.

21. The high-efficiency lighting device according to claim 18 further comprising second insulation units respectively formed on surfaces of said micro and nano structures of zinc oxide, wherein said first insulation units and said second insulation units are made of PMMA (poly(methyl methacrylate)), SOG (Spin-On Glass), silicon dioxide ($SiO_2$), or silicon nitride ($Si_3N_4$).

22. The high-efficiency lighting device according to claim 18 further comprising a metal layer arranged between said first insulation units and said seed layer.

23. The high-efficiency lighting device according to claim 18, wherein said nitride layers fill up a space between two neighboring said micro and nano structures of zinc oxide.

24. The high-efficiency lighting device according to claim 18, wherein said micro and nano structures of zinc oxide are arranged equidistantly.

25. The high-efficiency lighting device according to claim 18, wherein said first electrode layer fills up a space between two neighboring said micro and nano structures of zinc oxide.

26. The high-efficiency lighting device according to claim 18, wherein said micro and nano structure of zinc oxide covers a portion of surfaces of said first insulation units.

27. The high-efficiency lighting device according to claim 18, wherein said first electrode layer partially or completely covers said nitride layers.

28. The high-efficiency lighting device according to claim 18, wherein said micro and nano structure of zinc oxide is made of a P-type zinc oxide or an N-type zinc oxide; said conductive substrate is made of silicon; said seed layer is made of zinc oxide, gold, tin, or cobalt.

29. The high-efficiency lighting device according to claim 18, wherein said nitride layer is made of a nitride semiconductor material or a nitride quantum well structure; said nitride semiconductor material is gallium nitride, indium gallium nitride, aluminum gallium nitride, or aluminum gallium indium nitride; said nitride quantum well structure is an indium gallium nitride quantum well structure.

30. The high-efficiency lighting device according to claim 18, wherein said micro and nano structure of zinc oxide has a shape of a column, a cone, a parallelepiped, or a hexagonal prism.

31. The high-efficiency lighting device according to claim 20, wherein said insulation substrate is made of sapphire, a glass, or a plastic; said first electrode layer and said second electrode layer is made of gold, silver, nickel, aluminum, platinum, ITO (Indium Tin Oxide), GITO (Gallium Indium Tin Oxide), ZITO (Zinc Indium Tin Oxide), FTO (Fluorine-doped Tin Oxide), zinc oxide, AZO (Aluminum Zinc Oxide), or IZO (Indium Zinc Oxide).

* * * * *